(12) United States Patent
Hsu et al.

(10) Patent No.: US 12,396,248 B2
(45) Date of Patent: *Aug. 19, 2025

(54) SEMICONDUCTOR DEVICE FABRICATION METHODS AND STRUCTURES THEREOF

(71) Applicant: Taiwan Semiconductor Manufacturing Company, Ltd., Hsin-Chu (TW)

(72) Inventors: Chung-Wei Hsu, Hsinchu (TW); Kuo-Cheng Chiang, Hsinchu County (TW); Mao-Lin Huang, Hsinchu (TW); Lung-Kun Chu, New Taipei (TW); Jia-Ni Yu, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/673,960

(22) Filed: May 24, 2024

(65) Prior Publication Data
US 2024/0312845 A1    Sep. 19, 2024

Related U.S. Application Data

(63) Continuation of application No. 18/069,052, filed on Dec. 20, 2022, now Pat. No. 11,996,334, which is a
(Continued)

(51) Int. Cl.
*H01L 21/8238* (2006.01)
*H01L 27/092* (2006.01)
(Continued)

(52) U.S. Cl.
CPC ....... *H10D 84/038* (2025.01); *H10D 30/6735* (2025.01); *H10D 62/119* (2025.01);
(Continued)

(58) Field of Classification Search
CPC ..... H01L 21/823857; H01L 21/823828; H01L 27/092; H01L 29/0669; H01L 29/42392;
(Continued)

(56) References Cited

U.S. PATENT DOCUMENTS 8,836,016 B2    9/2014    Wu et al.
8,841,701 B2    9/2014    Lin et al.
(Continued)

FOREIGN PATENT DOCUMENTS

KR    20140110704 A    9/2014
KR    20140142957 A    12/2014
(Continued)

*Primary Examiner* — Tong-Ho Kim
(74) *Attorney, Agent, or Firm* — HAYNES AND BOONE, LLP

(57) ABSTRACT

A method includes providing a first channel layer of a first transistor and a second channel layer of a second transistor over a substrate, forming a dipole layer over the first channel layer and the second channel layer, forming a patterned hard mask covering the second channel layer and exposing the first channel layer, removing the dipole layer from the first channel layer, removing the patterned hard mask, performing a thermal drive-in process, forming an interfacial dielectric layer on the first channel layer and the dipole layer, and forming a high-k dielectric layer on the interfacial dielectric layer. The dipole layer includes a p-dipole material.

20 Claims, 25 Drawing Sheets

Related U.S. Application Data continuation of application No. 17/161,905, filed on Jan. 29, 2021, now Pat. No. 11,600,533.

(60) Provisional application No. 63/080,289, filed on Sep. 18, 2020.

(51) Int. Cl.

| | | |
|---|---|---|
| *H01L 29/06* | (2006.01) | |
| *H01L 29/423* | (2006.01) | |
| *H10D 30/67* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |

(52) U.S. Cl.
CPC ..... *H10D 84/0172* (2025.01); *H10D 84/0181* (2025.01); *H10D 84/85* (2025.01)

(58) Field of Classification Search
CPC ............... H01L 29/0673; H01L 29/517; H01L 29/66439; H01L 29/78696; H01L 21/823807; H01L 27/088; H01L 21/823462; H01L 29/775; H01L 21/823821; H01L 27/0924; H01L 29/66742; H01L 29/78654; B82Y 10/00
USPC ........................................................ 257/288
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 11,222,892 B2 | 1/2022 | Su et al. | |
| 11,233,005 B1 | 1/2022 | Chen et al. | |
| 11,355,601 B2 | 6/2022 | Chiang et al. | |
| 11,387,346 B2 | 7/2022 | Huang et al. | |
| 11,443,987 B2 | 9/2022 | Chen et al. | |
| 11,594,614 B2 | 2/2023 | Yu et al. | |
| 11,600,533 B2 * | 3/2023 | Hsu .................... | H10D 30/6735 |
| 11,715,781 B2 | 8/2023 | Huang et al. | |
| 11,791,218 B2 | 10/2023 | Chu et al. | |
| 11,996,334 B2 * | 5/2024 | Hsu .................... | H10D 84/0172 |
| 2019/0312120 A1 | 10/2019 | Zhang et al. | |
| 2019/0348530 A1 | 11/2019 | Ando et al. | |
| 2019/0371903 A1 | 12/2019 | Bao et al. | |
| 2020/0020690 A1 | 1/2020 | Ando et al. | |
| 2020/0083326 A1 | 3/2020 | Ok et al. | |
| 2021/0126102 A1 | 4/2021 | Nakjin et al. | |
| 2021/0242092 A1 | 8/2021 | Chen et al. | |
| 2021/0359142 A1 | 11/2021 | Huang et al. | |
| 2021/0366783 A1 | 11/2021 | Chu et al. | |
| 2021/0399104 A1 * | 12/2021 | Chang .................. | H10D 84/853 |

FOREIGN PATENT DOCUMENTS

| | | |
|---|---|---|
| KR | 20160126485 A | 11/2016 |
| KR | 20170135115 A | 12/2017 |
| KR | 20180091245 A | 8/2018 |
| KR | 20200007583 A | 1/2020 |
| TW | 201933446 A | 8/2019 |

* cited by examiner

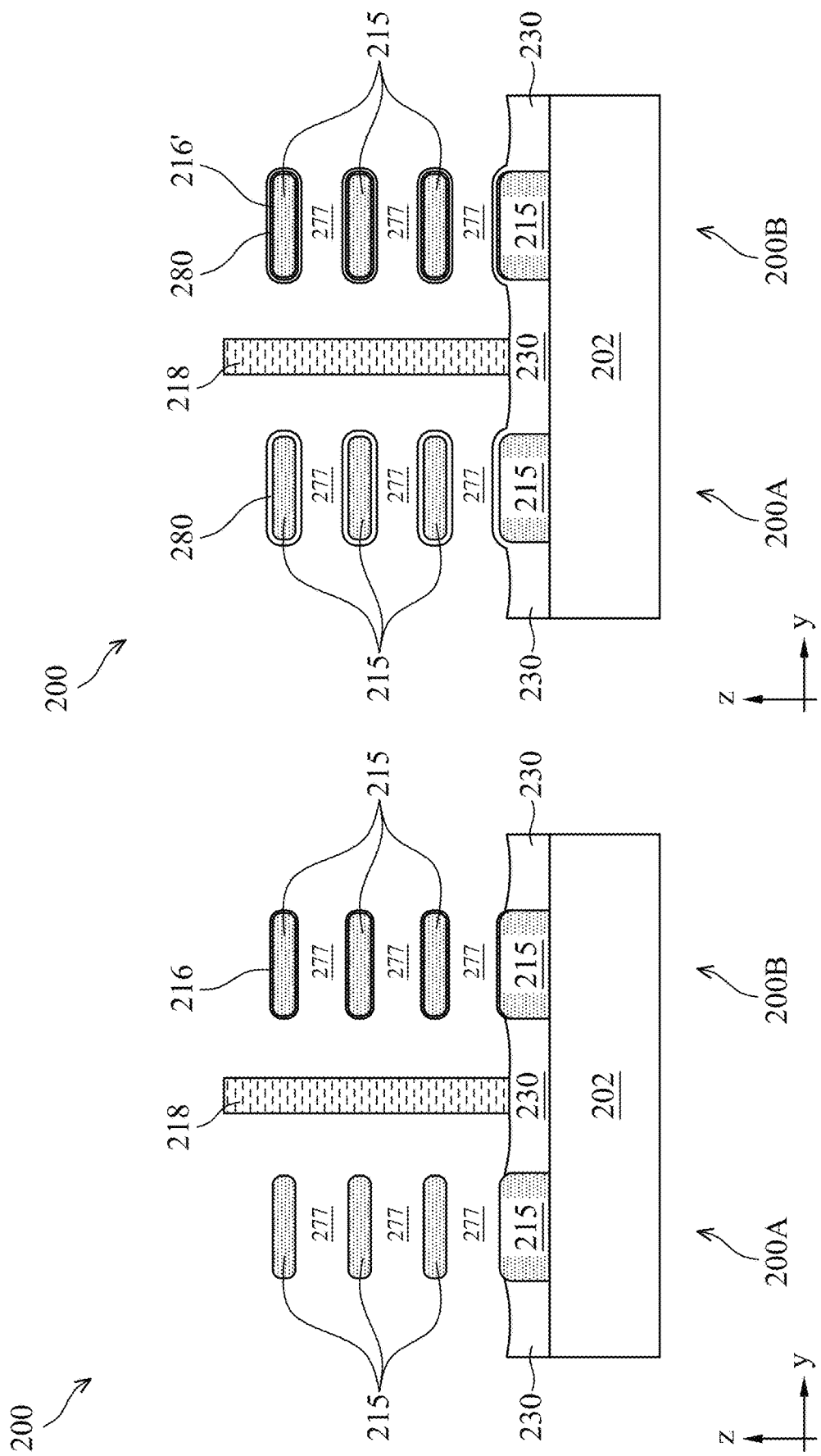

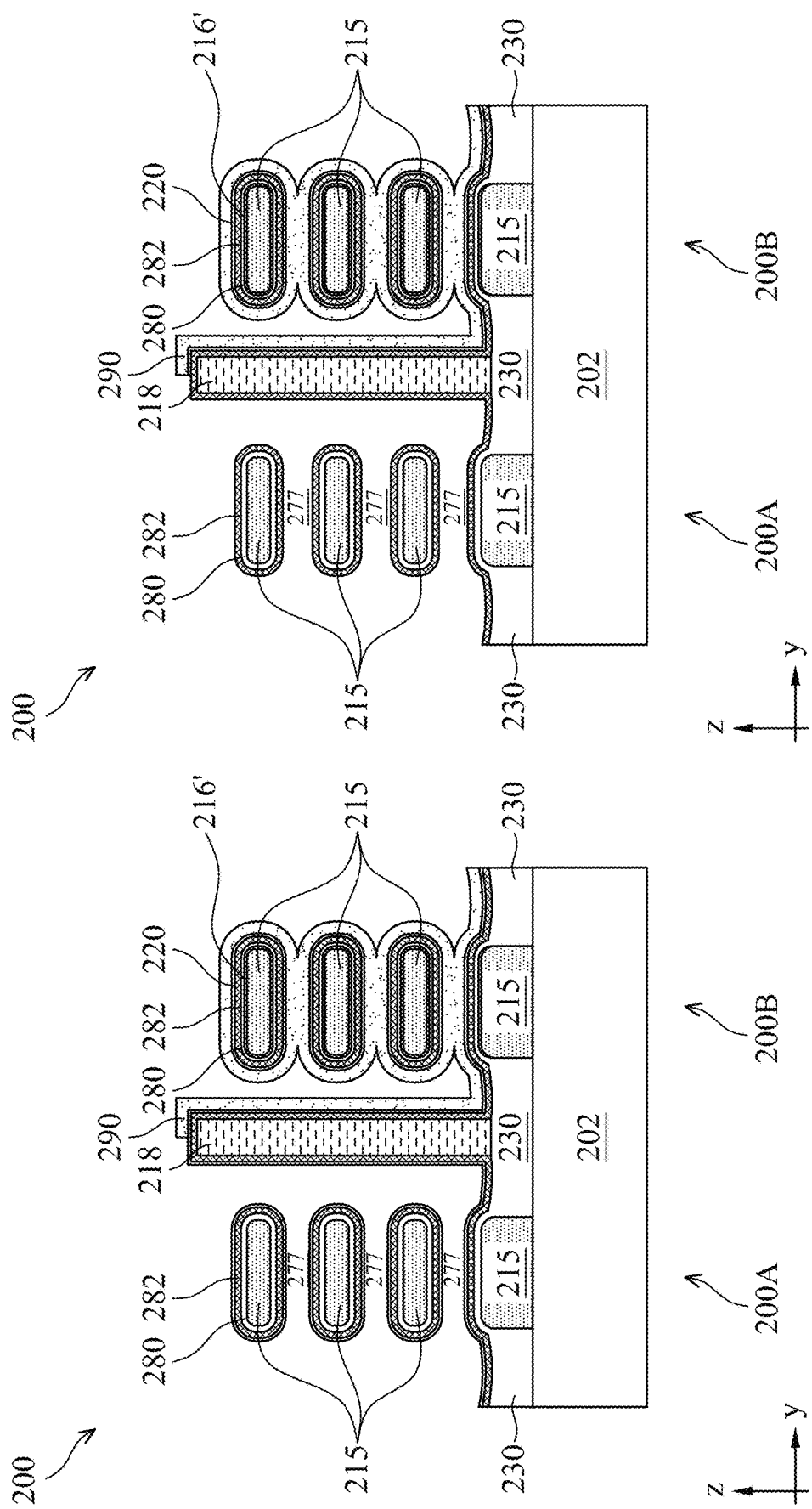

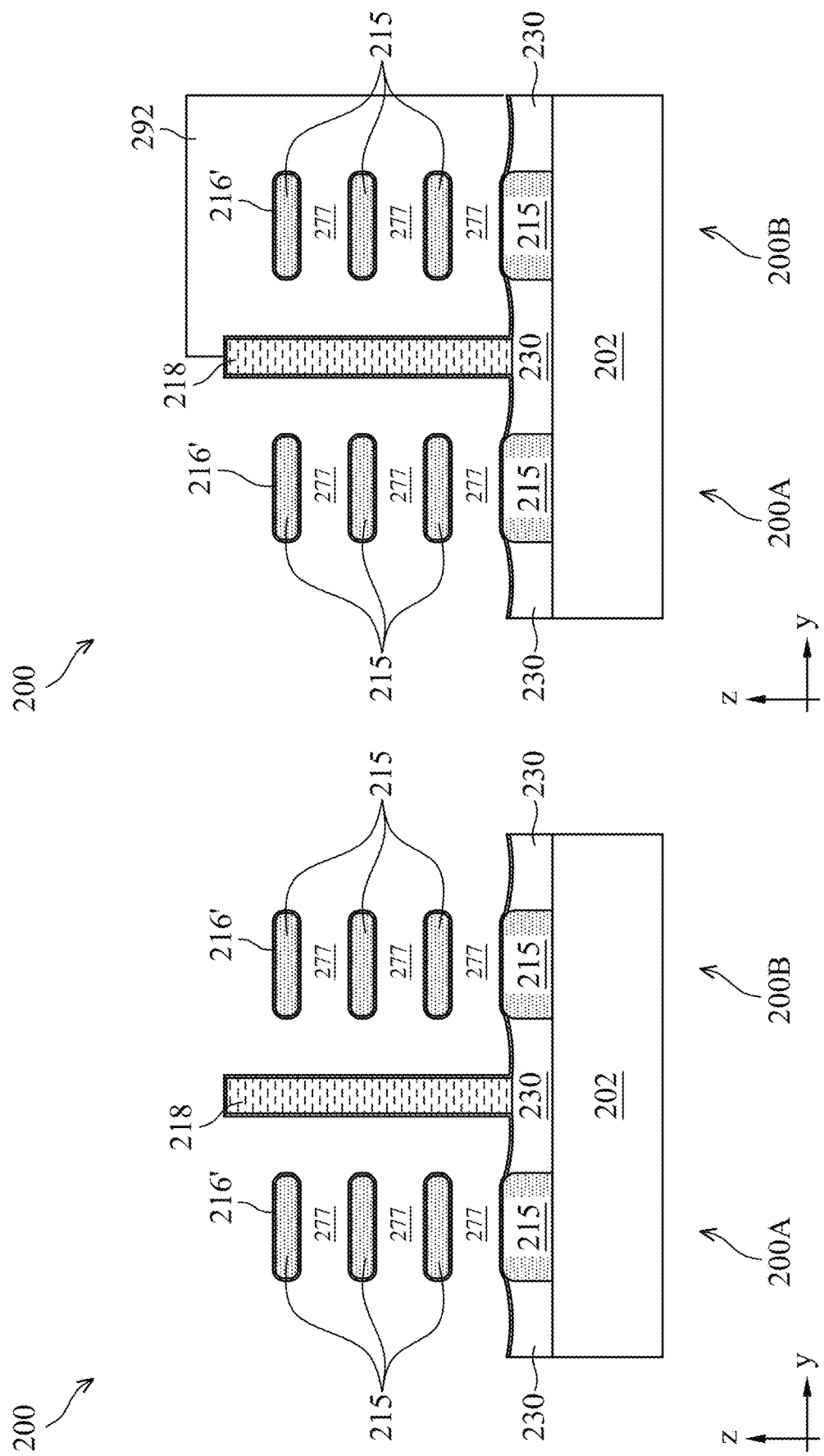

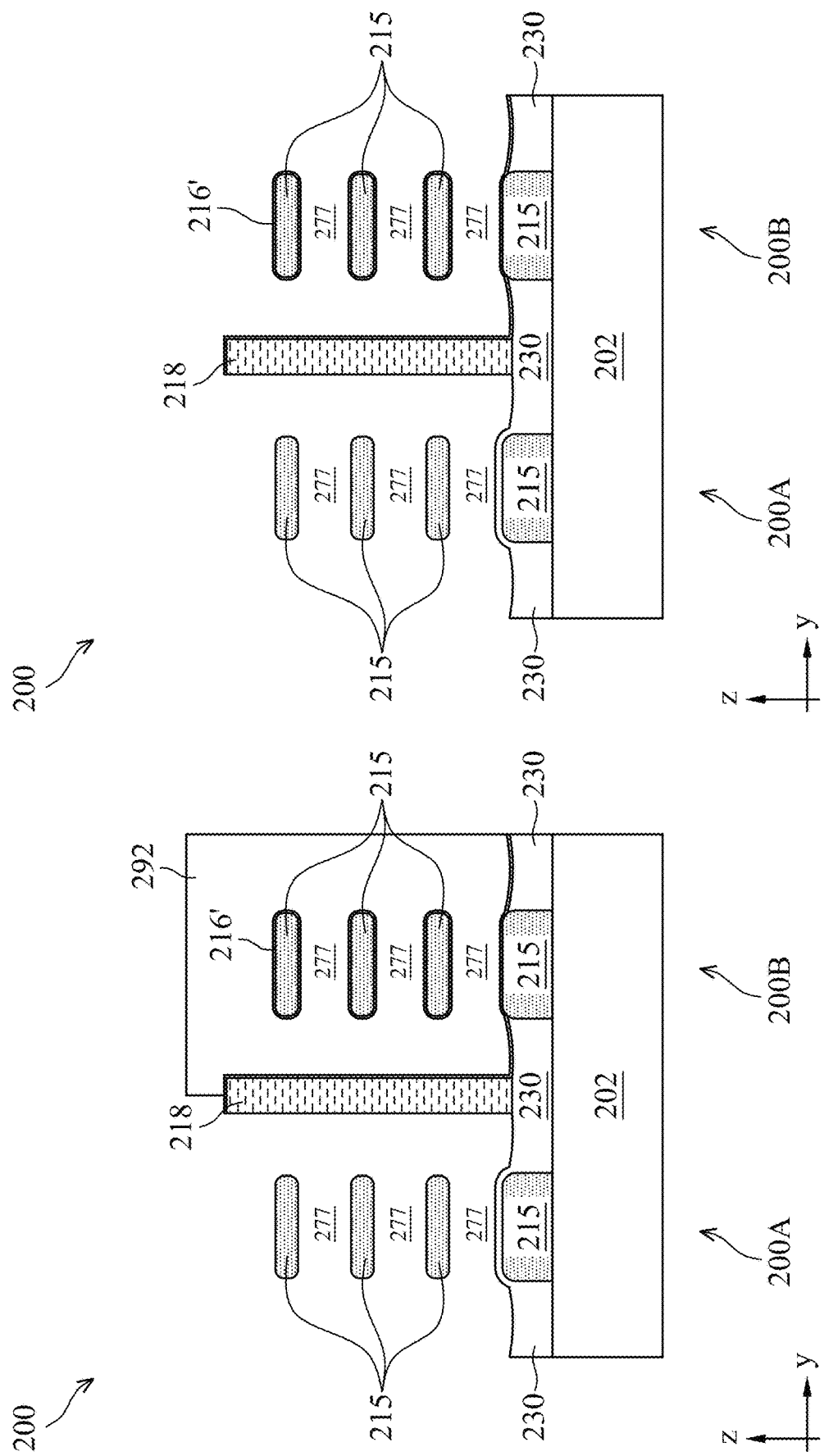

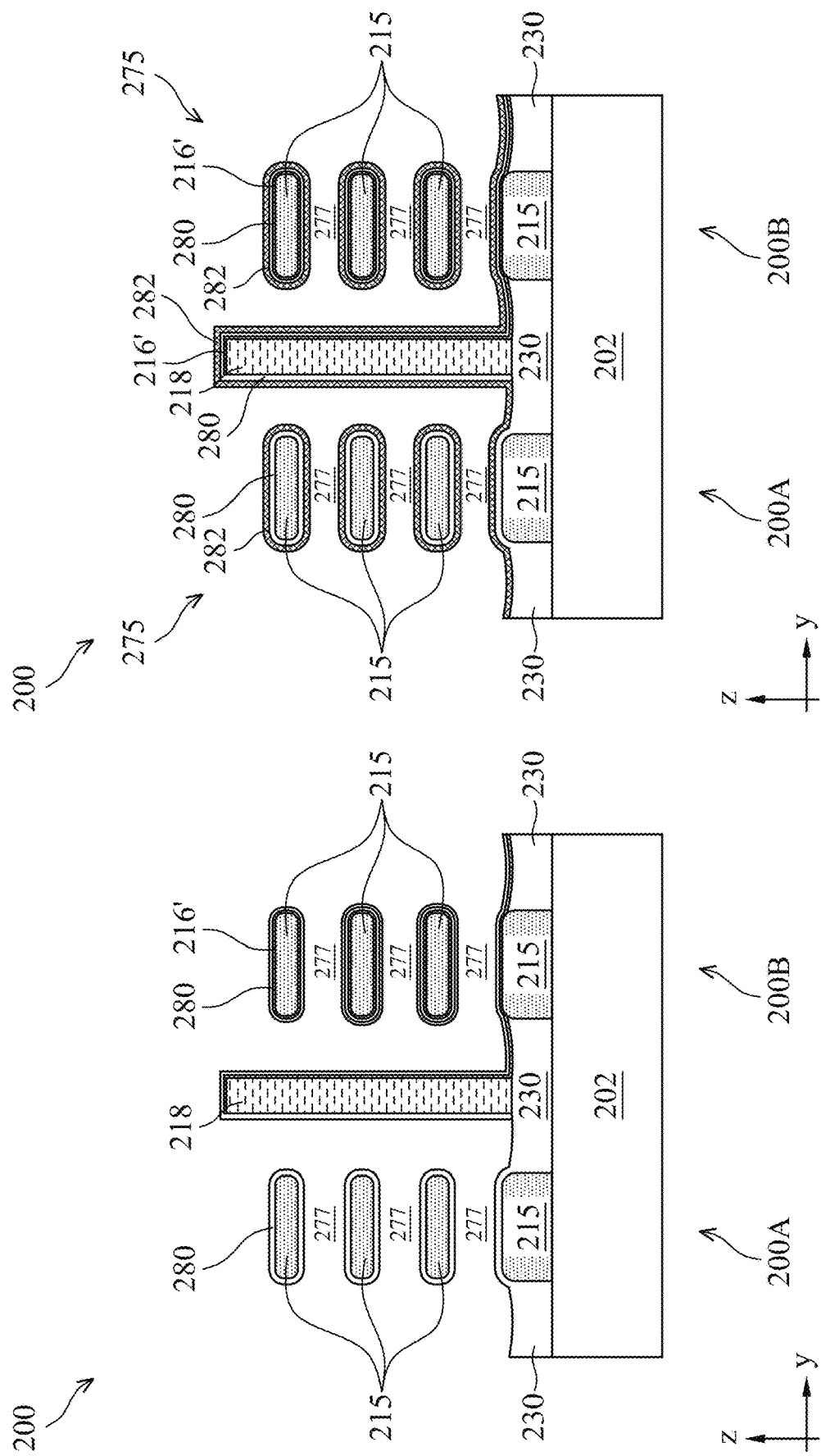

SEMICONDUCTOR DEVICE FABRICATION METHODS AND STRUCTURES THEREOF

PRIORITY

This is a continuation application of U.S. patent application Ser. No. 18/069,052, filed Dec. 20, 2022, which is a continuation application of U.S. patent application Ser. No. 17/161,905, filed Jan. 29, 2021, and issued as U.S. Pat. No. 11,600,533, which is a non-provisional application of and claims priority to U.S. Provisional Patent Application Ser. No. 63/080,289, filed Sep. 18, 2020, each of which is hereby incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advances is how to provide CMOS devices with multiple threshold voltages (Vt) for boosting performance for some transistors while reducing power consumption for some other transistors. Particularly, providing multiple Vt's has been challenging for multi-gate devices, such as FinFET, gate-all-around (GAA) devices including nanowire devices and nanosheet devices, and other types of multi-gate devices. One reason is that these devices are very small and there is not much room for tuning their Vt's using different work function metals. Accordingly, although existing CMOS devices (particularly, multi-gate devices) and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12, 13, 14, and 15 are diagrammatic cross-sectional views of the CMOS device in FIG. 2A, in portion, at various fabrication stages (such as those associated with the method in FIGS. 1A and 1B) according to various aspects of the present disclosure.

FIGS. 20, 21, 22, 23, 24, 25, and 26 are diagrammatic cross-sectional views of the CMOS device in FIG. 2A, in portion, at various fabrication stages (such as those associated with the method in FIGS. 19 and 1B) according to various aspects of the present disclosure.

DETAILED DESCRIPTION

Figure 1A:
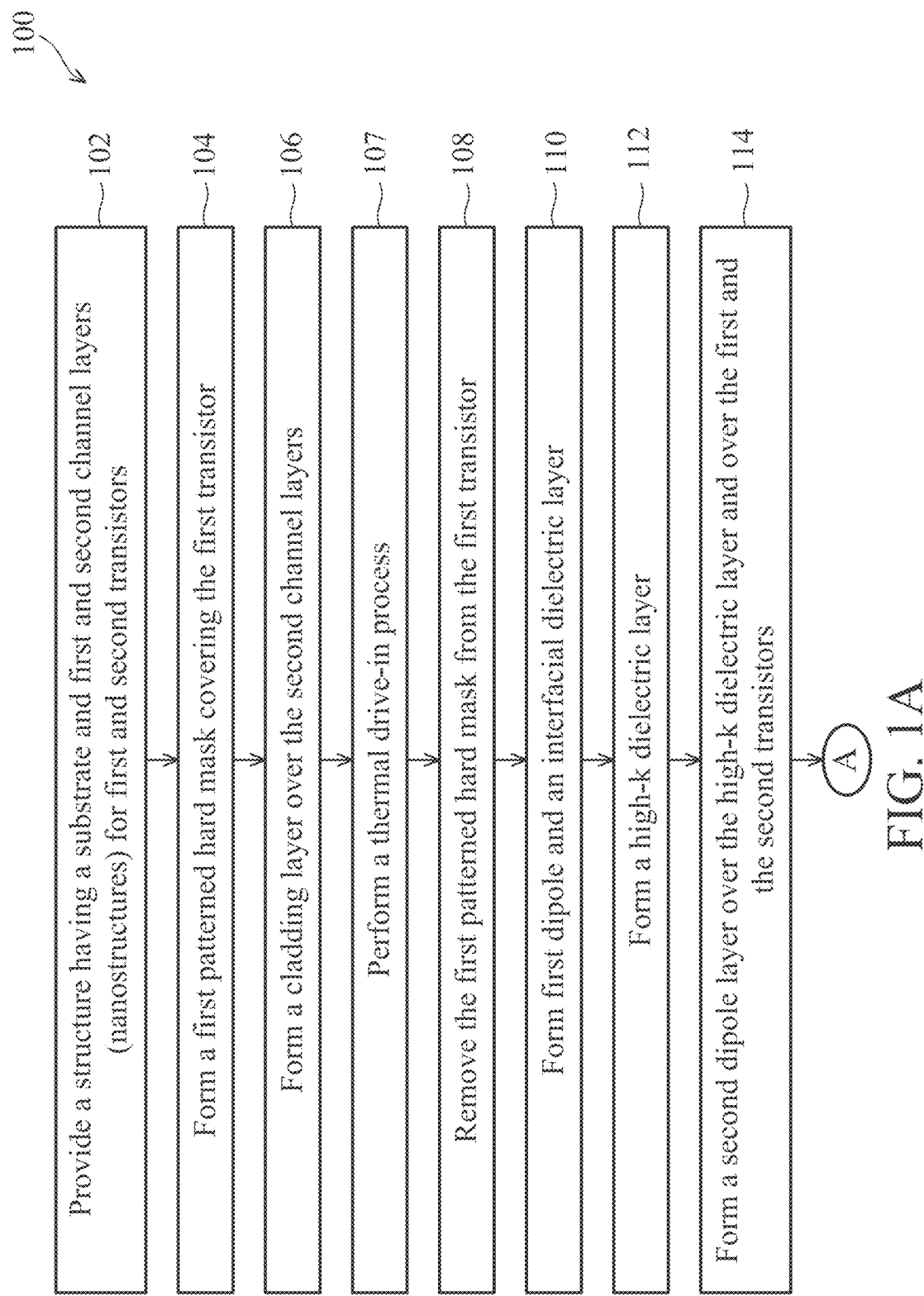
FIGS. 1A and 1B show a flow chart of a method for fabricating a CMOS device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to integrated circuit (IC) devices, and more particularly, to IC devices having both n-type MOSFETs (metal-oxide-semiconductor field effect transistors) and p-type MOSFETs. In other words, the IC devices are CMOS (complementary metal-oxide-semiconductor) devices. In some respects, the present disclosure relates to tuning the threshold voltages (Vt) of CMOS devices to provide multiple Vt's for n-type MOSFET (or NMOSFET) devices and multiple Vt's for p-type MOSFET (or PMOSFET) devices by incorporating different types of dipole materials into the gate dielectric layers of the respective devices. For example, some embodiments of the present disclosure may incorporate an n-type dipole material into a gate dielectric layer of an NMOSFET to further reduce its threshold voltage and incorporate a p-type dipole material into a gate dielectric layer of a PMOSFET to further reduce its threshold voltage. For another example, some embodiments of the present disclosure may incorporate an n-type dipole material into a gate dielectric layer of a PMOSFET to increase its threshold voltage and incorporate a p-type dipole material into a gate dielectric layer of an NMOSFET to increase its threshold voltage. For yet another example, some embodiments of the present disclosure incorporate both a p-type dipole material and an n-type dipole material into a gate dielectric layer of a transistor (which can be an NMOSFET or a PMOSFET) to tune the threshold voltage of the transistor. Advantageously, using the present disclosure, both NMOSFETs and PMOSFETs can be flexibly provided with multiple threshold voltages by incorporation of the dipole materials even with the same work function metal. This obviates the need of patterning work function metals, making the process very suitable for nano-sized transistors, such as FinFET and GAA transistors.

Figure 1B:
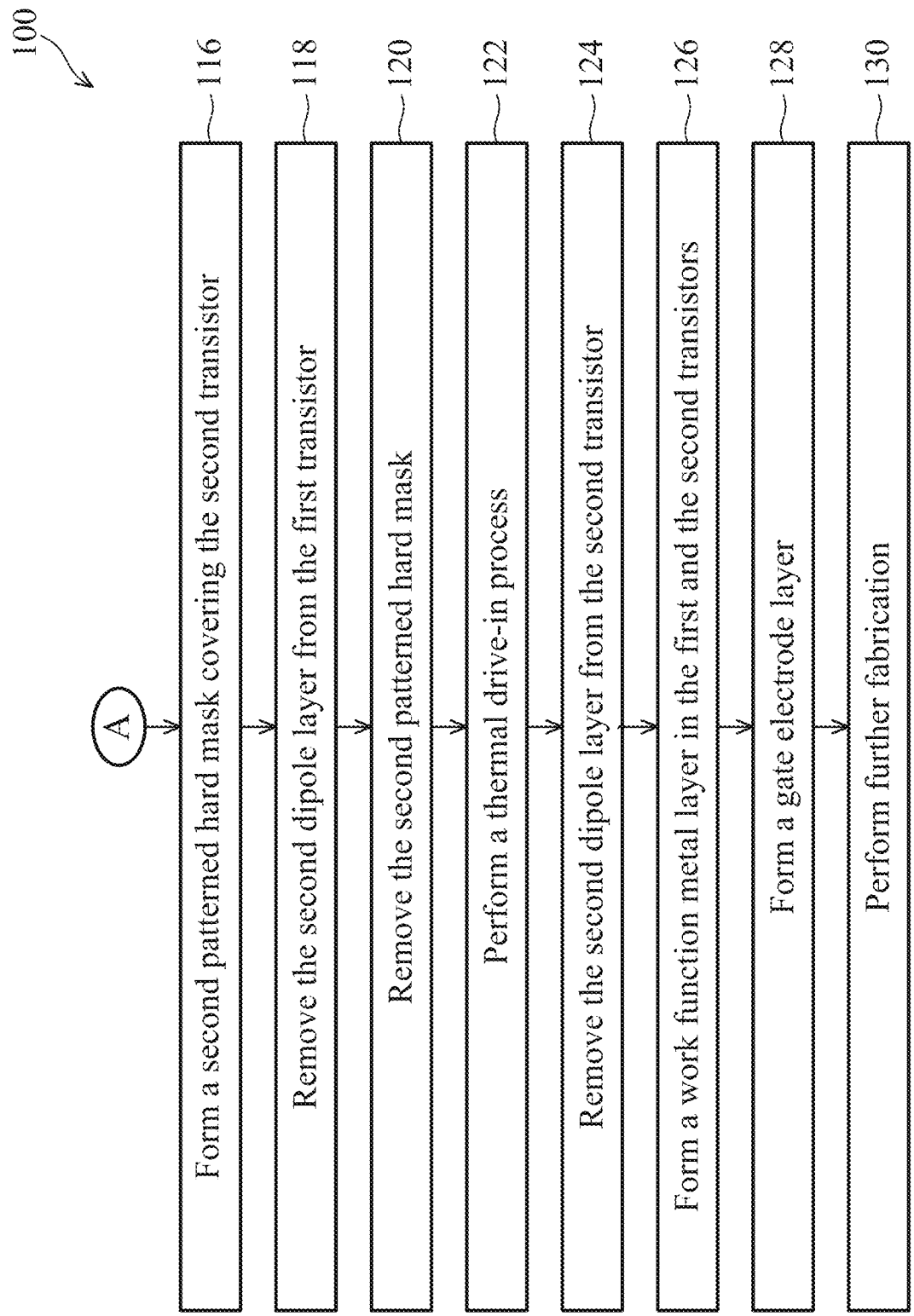
Figure 2A:
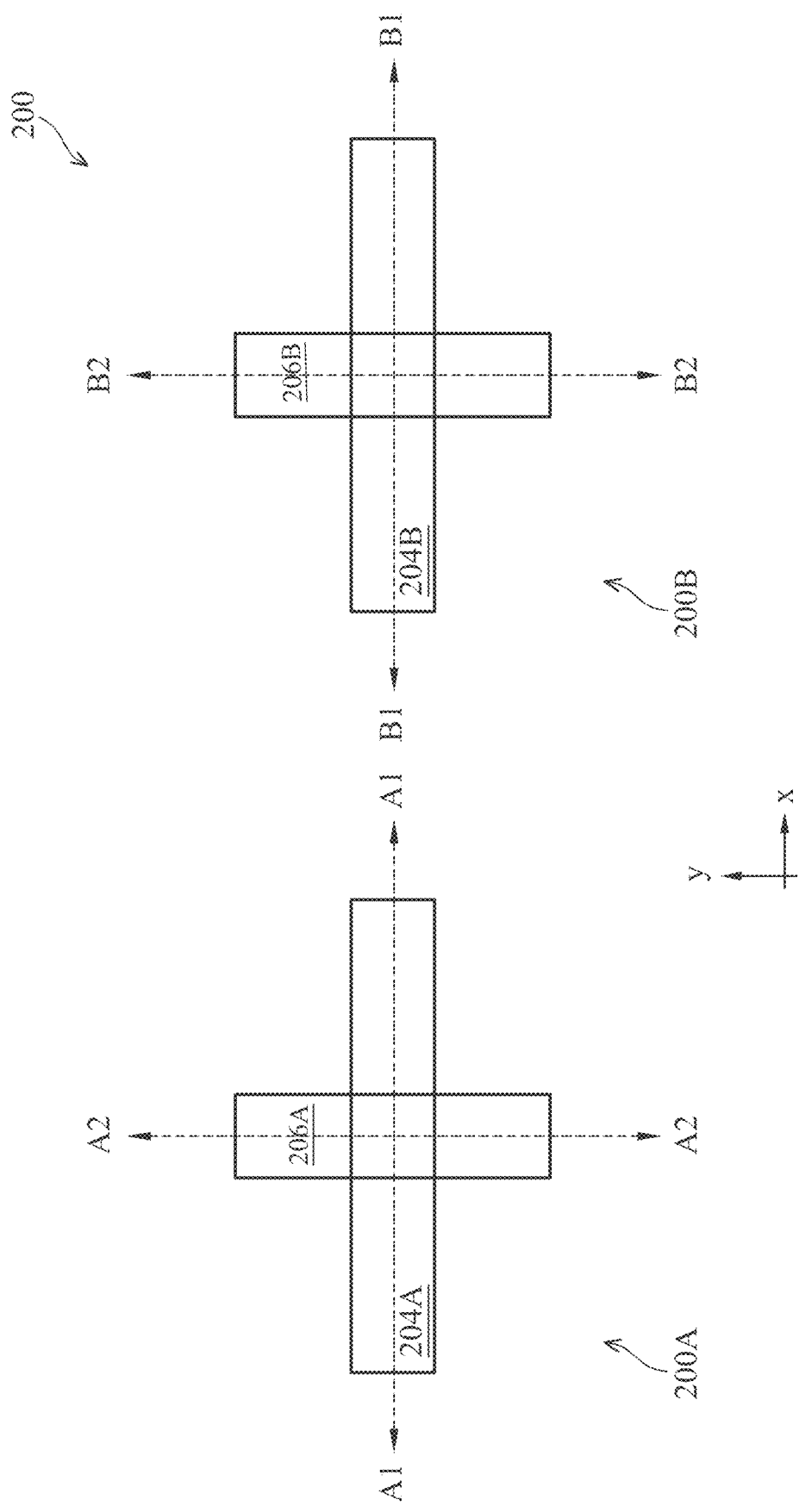
FIG. 2A is a diagrammatic top view of a CMOS device, in portion, according to various aspects of the present disclosure.

FIGS. 1A and 1B show a flow chart of a method 100 for fabricating a CMOS device according to various aspects of the present disclosure. In some embodiments, the method 100 fabricates a multi-gate device that includes p-type GAA transistors and n-type GAA transistors. Additional processing is contemplated by the present disclosure. Additional steps can be provided before, during, and after the method 100, and some of the steps described can be moved, replaced, or eliminated for additional embodiments of the method 100. The method 100 is described below in conjunction with FIGS. 2A through 17 that illustrate a CMOS device 200, in portion, according to some embodiments. FIG. 2A is a diagrammatic top view of the CMOS device 200, in portion, at a fabrication stage associated with method 100 in FIGS. 1A-1B according to various aspects of the present disclosure. FIGS. 2B-17 are diagrammatic cross-sectional views of the device 200, in portion, at various fabrication stage associated with method 100 in FIGS. 1A-1B according to various aspects of the present disclosure.

The device 200 is a multi-gate (or multigate) device in the present embodiments, and may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-17 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 2C:
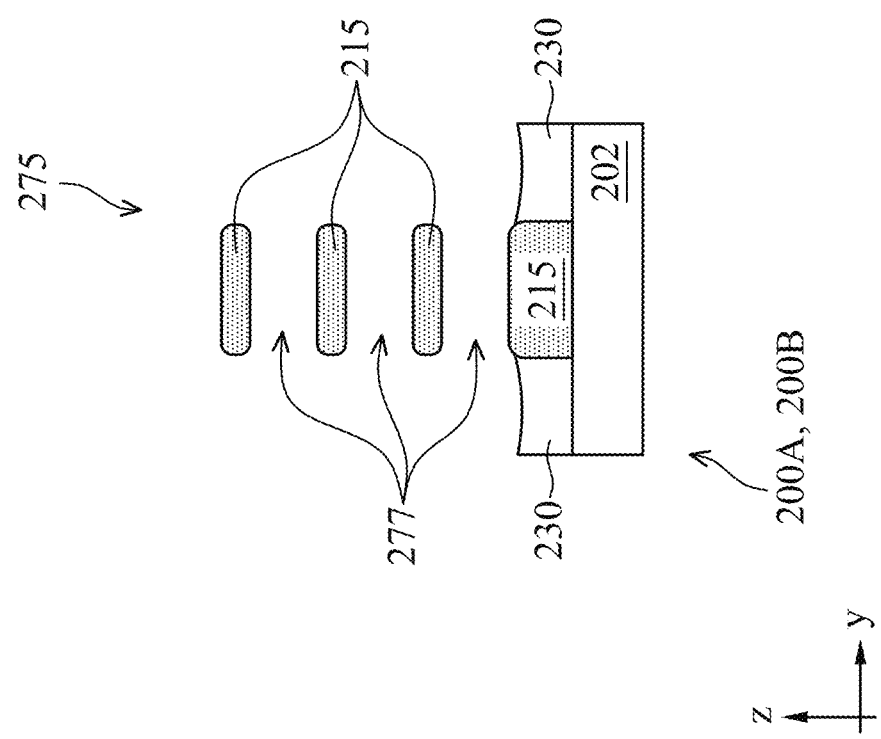
FIGS. 2B, 2C, and 2D are diagrammatic cross-sectional views of the CMOS device in FIG. 2A, in portion, according to an embodiment of the present disclosure.
Figure 2B:
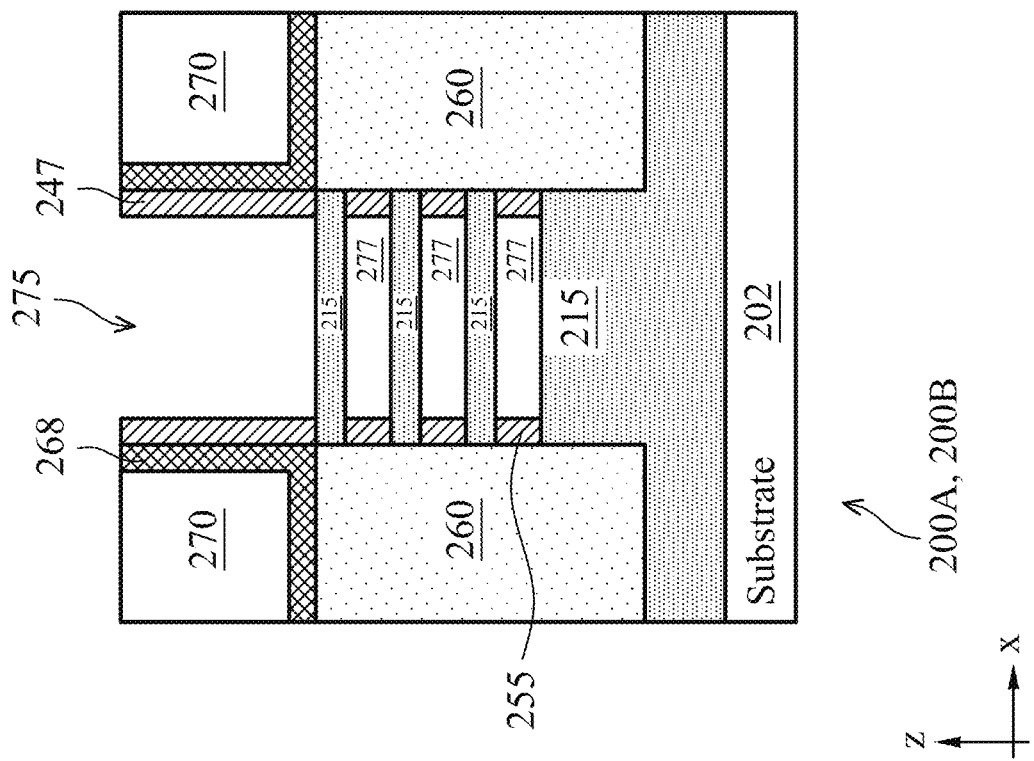
Figure 2D:
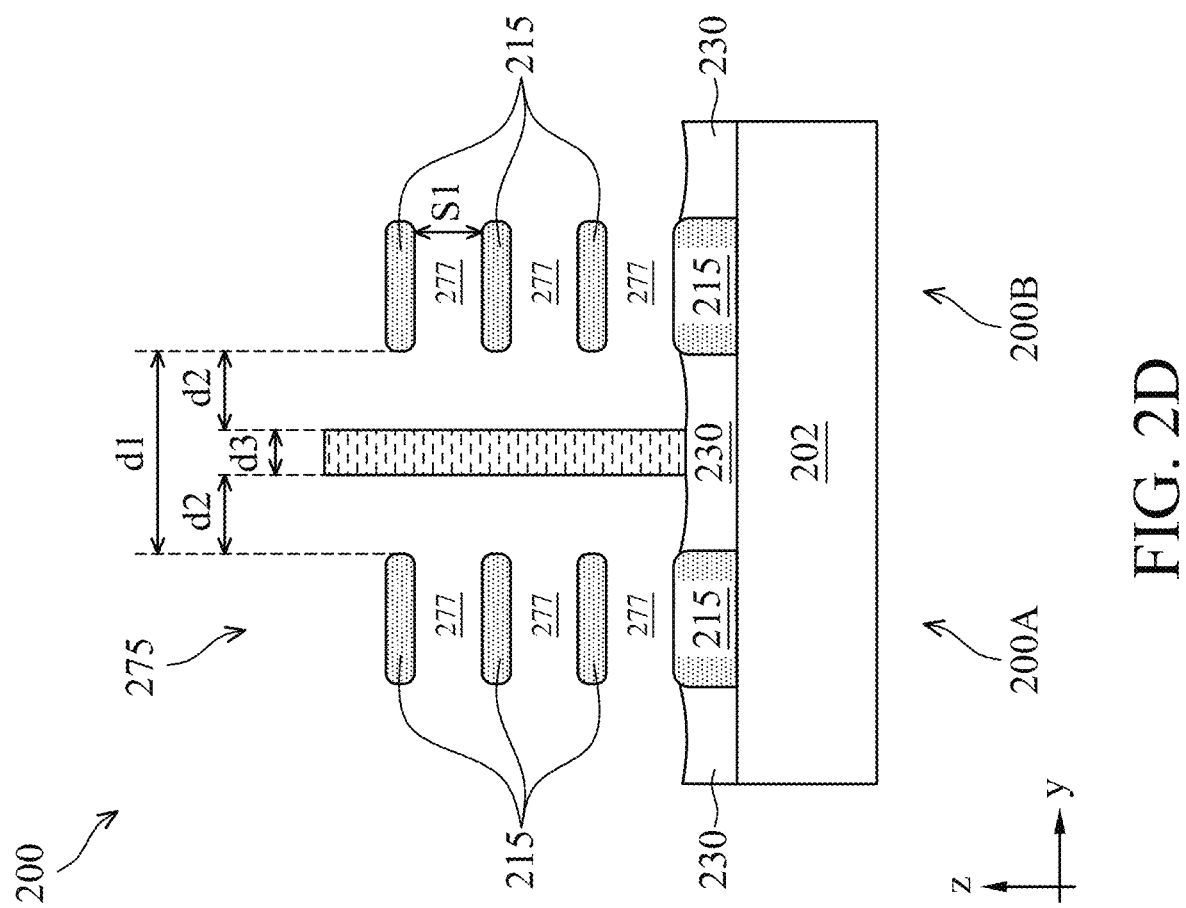

At operation 102, the method 100 (FIG. 1A) provides an initial structure of the CMOS device 200, a portion of which is shown in FIGS. 2A-2D. Particularly, FIG. 2A illustrates that the CMOS device 200 includes two transistors 200A and 200B, which may be of the same conductivity-type or opposite conductivity-types. For example, the transistors 200A and 200B may both be n-type transistors, both be p-type transistors, or be one n-type transistor and one p-type transistor. The transistor 200A includes an active region 204A and a gate region 206A generally perpendicular to the active region 204A. The active region 204A includes a pair of source/drain regions and a channel region between the pair of source/drain regions. The gate region 206A engages the channel region. Similarly, the transistor 200B includes an active region 204B and a gate region 206B. FIG. 2B illustrate a cross-sectional view of the device 200 according to an embodiment, which can be a cross-sectional view of the device 200A or 200B along the A1-A1 or B1-B1 lines of FIG. 2A, respectively. FIG. 2C illustrate a cross-sectional view of the device 200 according to an embodiment, which can be a cross-sectional view of the device 200A or 200B along the A2-A2 or B2-B2 lines of FIG. 2A, respectively. In an embodiment, the two transistors 200A and 200B are adjacent to each other on the device 200, such as shown in FIG. 2D. Alternatively, the two transistors 200A and 200B are not adjacent to each other in another embodiment (not shown). The embodiments illustrated in FIGS. 2B, 2C, and 2D are nanosheet FETs, where their channel layers 215 are in the shape of sheets. The devices 200A and 200B are illustrated as having the same configuration for the sake of clarity to better understand the inventive concepts of the present disclosure. In various embodiments, the devices 200A and 200B can have different configurations. For example, they may have different number of channels and/or their channel layers 215 can be of different shapes or dimensions. For another example, any of the devices 200A and 200B can be a FinFET, a nanowire FET, a nanosheet FET, or a planar FET. In the following discussion, the transistor 200A is described as not incorporating a dipole material while the transistor 200B is described as incorporating both a p-dipole material and an n-dipole material for threshold voltage tuning. In various embodiment, either the transistor 200A or the transistor 200B or both the transistors 200A and 200B may incorporate no dipole material, p-dipole material(s) only, n-dipole material(s) only, or both p-dipole material(s) and n-dipole material(s) for tuning the threshold voltages thereof.

Referring to FIGS. 2B, 2C, and 2D, the device 200 includes a substrate (e.g., a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

As shown in FIG. 2B, each of the transistors 200A and 200B further includes a pair of source/drain features 260. For n-type transistors, the source/drain features 260 are of n-type (i.e., doped with n-type dopants). For p-type transistors, the source/drain features 260 are of p-type (i.e., doped with p-type dopants). The source/drain features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for n-type transistors, the source/drain features 260 may include silicon and be doped with carbon, phosphorous, arsenic, other n-type dopant, or combinations thereof; and for p-type transistors, the source/drain features 260 may include silicon germanium or germanium and be doped with boron, other p-type dopant, or combinations thereof.

As shown in FIGS. 2B, 2C, and 2D, each of the transistors 200A and 200B further includes a stack of semiconductor layers 215 suspended over the substrate 202 and connecting the pair of the source/drain features 260. The stack of semiconductor layers 215 serve as the transistor channels for the respective transistor. Accordingly, the semiconductor layers 215 are also referred to as channel layers 215. The channel layers 215 are exposed in respective gate trenches 275 which are resulted from the removal of dummy gates from the respective gate regions 206A and 206B (FIG. 2A) therein. The channel layers 215 may include single crystalline silicon in an embodiment. Alternatively, the channel layers 215 may comprise germanium, silicon germanium, or another suitable semiconductor material(s). Initially, the channel layers 215 are formed as part of a semiconductor layer stack that includes the channel layers 215 and other semiconductor layers of a different material or a different composition. The semiconductor layer stack is patterned into a shape of fins protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective source/drain features 260. The channel layers 215 are separated from each other and from the substrate 202 by gaps 277.

In some embodiments, each channel layer 215 has nanometer-sized dimensions. For example, each channel layer 215 may have a length (along the "x" direction) about 10 nm to about 300 nm, and a width (along the "y" direction) about 10 nm to about 80 nm, and a height (along the "z" direction) about 4 nm to about 8 nm in some embodiments. The vertical spacing (along the "z" direction) S1 between the channel layers 215 may be about 6 nm to about 12 nm in some embodiments. Thus, the channel layer 215 can be referred to as a "nanosheet," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers 215 can be referred to as a nanostructure. In some embodiments, the channel layers 215 may be cylindrical-shaped (e.g., nanowire), rectangular-shaped (e.g., nanobar), sheet-shaped (e.g., nanosheet), etc., or have other suitable shapes. In an embodiment, the spacing d1 (FIG. 2D) between the channel layers 215 of the two adjacent transistors 200A and 200B along the "y" direction is in a range of about 20 nm to about 40 nm. If the spacing d1 is too small (such as less than 20 nm), there might not be sufficient room for various fabrication steps performed to the transistors, such as metal gate filling and/or dipole material deposition and incorporation. If the spacing d1 is too large (such as greater than 40 nm), then the device 200 might not be able to meet the goal of aggressive scaling down.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

In the embodiment shown in FIG. 2D, the device 200 further includes a dielectric fin (or dummy fin) 218 over the isolation feature 230 and between the two adjacent transistors 200A and 200B. The dielectric fin 218 may include one or more layers of dielectric materials that isolate adjacent transistors. The dielectric fin 218 may include silicon oxide, silicon nitride, silicon oxynitride, tetraethoxysilane (TEOS) formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). The dielectric fin 218 may also include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric fin 218 is formed by any of the processes described herein, such as ALD, CVD, PVD, oxidation-based deposition process, other suitable process, or combinations thereof. The dielectric fin 218 may have a width d3 (along the y direction) in a range of about 5 nm to about 12 nm in an embodiment. The spacing between the dielectric fin 218 and the nearest channel layers 215 along the "y" direction is d2. It holds that d1=2d2+d3. In an alternative embodiment, the dielectric fin 218 is entirely omitted.

As shown in FIG. 2B, the device 200 further includes gate spacers 247 adjacent to the source/drain features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the source/drain features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255.

As shown in FIG. 2B, the device 200 further includes a contact etch stop layer (CESL) 268 disposed over the isolation features 230, the epitaxial source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Figures 3, 4:
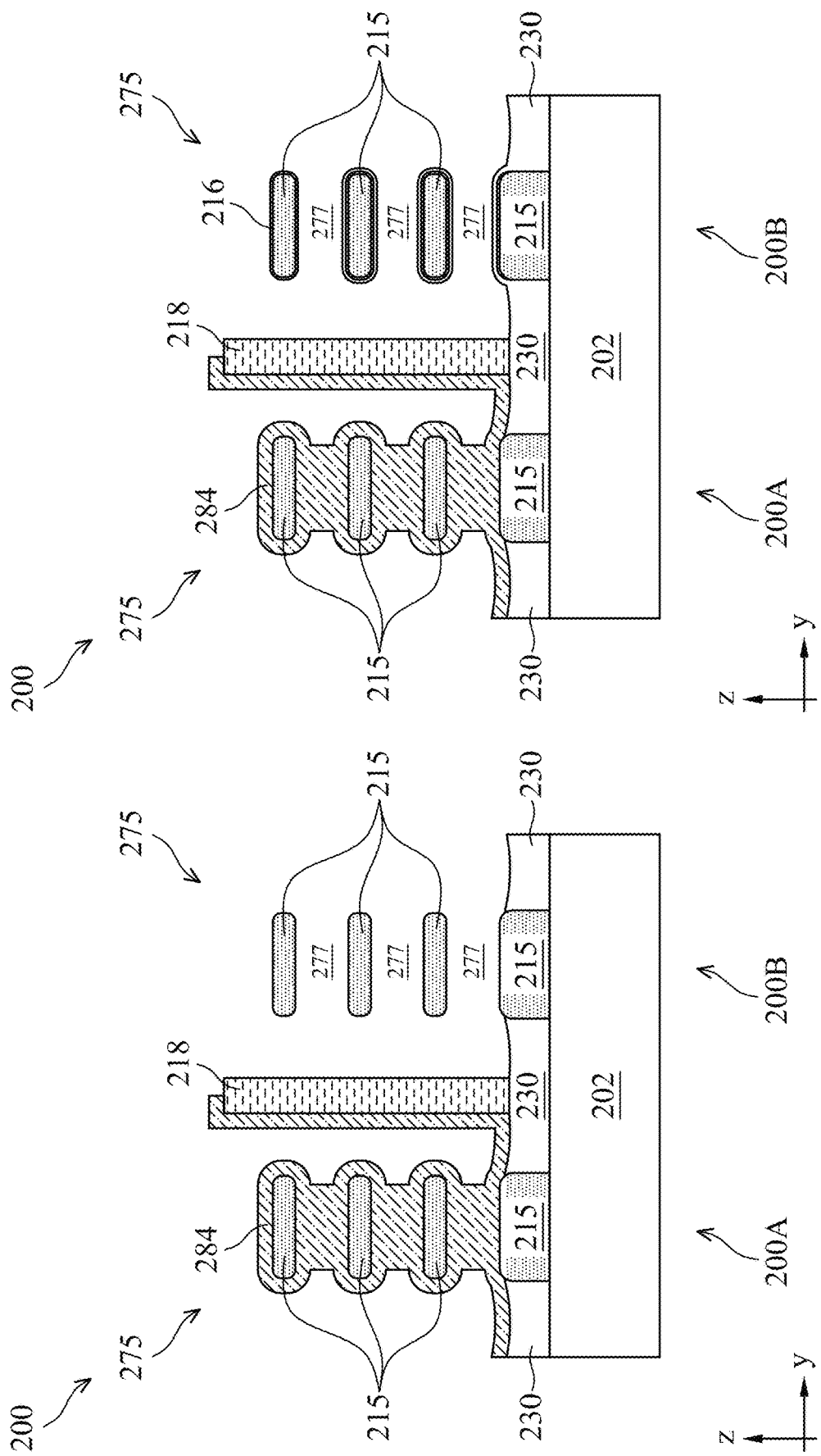

At the operation 104, the method 100 (FIG. 1A) forms a patterned hard mask 284 covering the transistor 200A and leaving the transistor 200B exposed for subsequent processes, such as shown in FIG. 3. In the embodiment depicted in FIG. 3, the patterned hard mask 284 partially fills the gate trench 275 and wraps around (surrounds) channel layers 215 in the transistor 200A. A thickness of the patterned hard mask 284 is configured to fill the gaps 277 between the adjacent channel layers 215 in the transistor 200A. In some embodiments, the thickness of patterned hard mask 284 is about 1.5 nm to about 5 nm. The patterned hard mask 284 includes a material that is different than the material of the dielectric fin 218, the isolation features 230, and the channel layers 215 to achieve etching selectivity between the patterned hard mask 284 and those features during an etching process such that patterned hard mask 284 can be selectively etched with minimal (to no) etching of those features. Further, in the present embodiment, the patterned hard mask 284 includes a material that resists the deposition of a cladding layer (such as the cladding layer 216) so that the cladding layer can be selectively deposited on the channel layers 215 in the transistor 200B without depositing on the patterned hard mask 284 (which will be discussed in more details with reference to FIG. 4). For example, the patterned hard mask 284 is free of BARC (bottom anti-reflective coating layer which is polymeric) when the cladding layer 216 is germanium. In some embodiments, the patterned hard mask 284 includes metal and oxygen (and can thus be referred to as a metal oxide layer), such as aluminum and oxygen (e.g., $AlO_x$, or alumina ($Al_2O_3$)). In some embodiments, the patterned hard mask 284 includes titanium nitride (TiN). The present disclosure contemplates patterned hard mask 284 including other semiconductor materials and/or other dielectric materials that can provide the desired property as described herein.

In an embodiment, the patterned hard mask 284 is formed by deposition, photolithography, and etching processes. For example, a sacrificial layer may be deposited over the substrate 202 using ALD, CVD, PVD, or other suitable process to cover both the transistors 200A and 200B. The sacrificial layer fills the gaps 277. Then, a BARC material is formed to fill in the gaps over the substrate 202 and to provide a substantially planar top surface. A photoresist (or resist) is spin coated over the BARC material and is patterned into a resist pattern using a photolithography process. Then, the BARC and the sacrificial layer are etched through the resist pattern. Subsequently, the resist pattern and the BARC are removed. The remaining portion of the sacrificial layer becomes the patterned hard mask 284.

At the operation 106, the method 100 (FIG. 1A) forms a cladding layer 216 over the surfaces of the channel layers 215 of the transistor 200B, such as shown in FIG. 4. In the present embodiment, the cladding layer 216 provides a p-dipole material or a precursor of a p-dipole material. For example, the p-dipole material may include germanium oxide, aluminum oxide, gallium oxide, or zinc oxide. As will be discussed, the p-dipole material will be segregated (or distributed) around the channel layers 215 and between the channel layers 215 and a subsequently formed interfacial dielectric layer (such as silicon dioxide). The p-dipole material serves to reduce the threshold voltage of the transistor 200B when the transistor 200B is a p-type transistor, and to increase the threshold voltage of the transistor 200B when the transistor 200B is an n-type transistor.

In the present embodiment, the cladding layer 216 is selectively deposited on the surfaces of the channel layers 215 (which have a semiconductor material) but not on the surfaces of the patterned hard mask 284, the dielectric fin 218, and the isolation features 230 (which have dielectric materials). In an embodiment, the cladding layer 216 includes a layer of germanium (Ge). The layer of germanium may be deposited using CVD, ALE (atomic layer epitaxy), or other suitable methods. For example, germanium may be deposited using CVD with $GeH_4$, $Ge_2H_6$, or other precursors. For example, germanium may be epitaxially grown from silicon using atomic layer epitaxy with $GeH_2Cl_2$ and other precursors. In an embodiment, the cladding layer 216 may have a thickness in a range from about 0.5 Å to about 15 Å, such as from about 1 Å to 3 Å. If the cladding layer 216 is too thin (such as less than 0.5 Å), it may suffer from non-uniformity issue across the device 200, which affects the uniformity of threshold voltage tuning. If the cladding layer 216 is too thick (such as greater than 15 Å), it might affect subsequent fabrication, such as leaving insufficient space for work function metal and metal-gate filling. Still further, the material and the thickness of the cladding layer 216 can be designed based on the desired amount of threshold voltage tuning. In some embodiment, a thicker cladding layer 216 leads to a greater change in the transistor 200B's threshold voltage. In various embodiments, using materials such as $GeO_2$, $Al_2O_3$, $Ga_2O_3$, or ZnO and the disclosed thickness above, the threshold voltage of the transistor 200B may be adjusted up (for n-type transistor) or down (for p-type transistor) in a range of about 20 mV to about 450 mV.

At operation 107, the method 100 (FIG. 1A) performs a thermal drive-in process so that some elements from the cladding layer 216 are driven into the outer portion of the channel layers 215. The thermal drive-in process may include rapid thermal annealing (RTA), millisecond annealing (MSA), microsecond annealing (μSA), or other suitable annealing processes. In the present embodiment, the annealing temperature is controlled to be in a range about 500° C. to about 1200° C. The temperature is selected such that it does not adversely affect the existing structures and features of the device 200 yet sufficiently high to drive elements from the cladding layer 216 into the outer portion of the channel layers 215. In an embodiment where the cladding layer 216 includes a layer of germanium, the thermal drive-in process may convert the whole or part of the cladding layer 216 into silicon germanium alloy $Si_{1-x}Ge_x$ where x ranges from about 0.01 to 1. In embodiments where the cladding layer 216 includes an oxide (such as $GeO_2$, $Al_2O_3$, $Ga_2O_3$, or ZnO), the thermal drive-in process drives some of the oxide into the channel layers 215 in the transistor 200B. In some embodiment, the operation 107 is omitted in the method 100.

At the operation 108, the method 100 (FIG. 1A) removes the patterned hard mask 284 from the transistor 200A, such as shown in FIG. 5. The patterned hard mask 284 may be removed by an etching process that is tuned to selectively remove the patterned hard mask 284 with little to no etching to the dielectric fin 218, the isolation features 230, the channel layers 215, and the cladding layer 216. The etching process may include a wet etching process, a dry etching process, or other suitable etching processes.

At the operation 110, the method 100 (FIG. 1A) forms an interfacial dielectric layer 280 wrapping around the channel layers 215 in the transistor 200A and wrapping around the cladding layer 216 (or a derivative thereof) in the transistor 200B, such as shown in FIG. 6. In an embodiment where the cladding layer 216 includes a layer of germanium (or silicon germanium), the operation 110 applies a cleaning process with an oxygen-containing cleaning solution to the channel layers 215 and the cladding layer 216. For example, the cleaning solution may be Standard Clean 1 (SC1 or SC-1) or Standard Clean 2 (SC2 or SC-2). SC1 refers to a solution having deionized water (DIW), ammonia ($NH_3$), and hydrogen peroxide $H_2O_2$ with a proper mixing ratio. SC2 refers to a solution having deionized water (DIW), hydrochloric acid (HCl), and hydrogen peroxide $H_2O_2$ with a proper mixing ratio. The cleaning process simultaneously produces silicon oxide (such as $SiO_2$) over the channel layers 215 in the transistor 200A and silicon oxide (such as $SiO_2$) and germanium oxide (such as $GeO_2$) over the channel layers 215 in the transistor 200B. Since the cladding layer 216 changes composition from germanium (or silicon germanium) to germanium oxide, it is re-labeled as 216' in FIG. 6 and the following figures, and it is referred to as p-dipole layer 216'. In an embodiment, the interfacial dielectric layer 280 has a thickness in a range of about 5 Å to about 15 Å, and the p-dipole layer 216' has a thickness in a range of about 0.5 Å to about 3 Å. In embodiments, the interfacial dielectric layer 280 includes a dielectric material, such as $SiO_2$, HfSiO, SiON, other silicon-containing dielectric material, other suitable dielectric material, or combinations thereof. In embodiments, the p-dipole layer 216' includes germanium oxide, aluminum oxide, gallium oxide, zinc oxide, or other suitable p-dipole material. In embodiments, the interfacial layer 280 is formed by any of the processes described herein, such as thermal oxidation, chemical oxidation, ALD, CVD, other suitable process, or combinations thereof. In embodiments where the cladding layer 216 includes an oxide (such as $GeO_2$, $Al_2O_3$, $Ga_2O_3$, or ZnO), the operation 106 includes the thermal drive-in process to drive some of the oxide into the channel layers 215 of the transistor 200B. To further such embodiments, the cleaning process removes excessive oxide outside of the channel layer 215 and simultaneously produces the interfacial dielectric layer 280 by reacting the semiconductor material of the channel layers 215 with oxygen (and some other reactants).

Figures 7, 8:
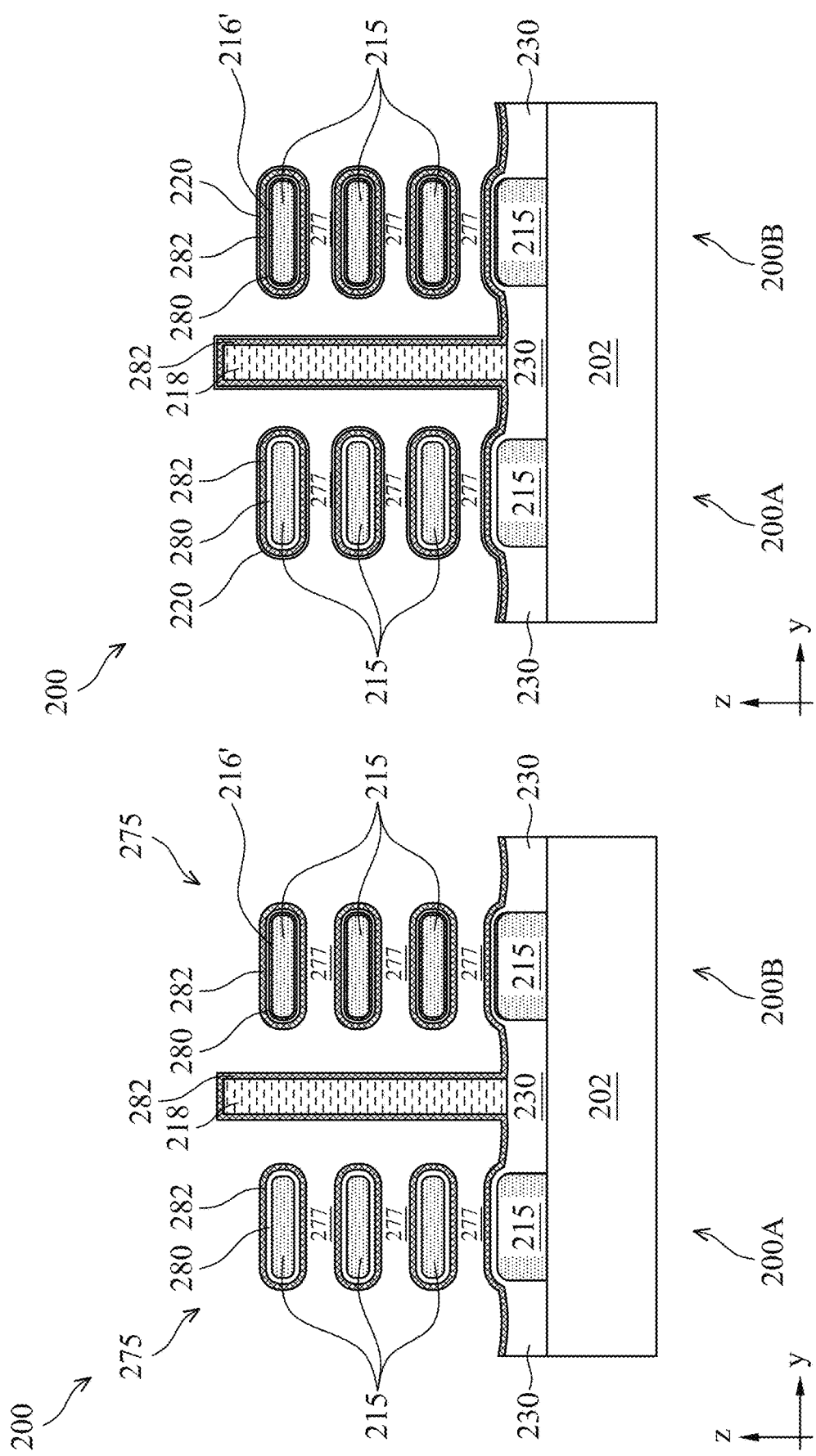

At the operation 112, the method 100 (FIG. 1A) forms a high-k dielectric layer 282 over the interfacial layer 280 and over other surfaces exposed in the gate trenches 275, such as shown in FIG. 7. The high-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), (Ba,Sr)$TiO_3$ (BST), hafnium dioxide-alumina ($HfO_2$—$Al_2O_3$) alloy, other suitable high-k dielectric material, or combinations thereof. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 3 nm.

At the operation 114, the method 100 (FIG. 1A) forms another dipole layer 220 over the high-k dielectric layer 282, such as shown in FIG. 8. The dipole layer 220 includes a dielectric material for dipole formation in the gate dielectric layers of the transistor 200B (in this example, the dipole layer 220 is removed from the transistor 200A as will be discussed). In the present embodiment, the dipole layer 220 includes an n-dipole material such as lanthanum oxide ($La_2O_3$), yttrium oxide ($Y_2O_3$), titanium oxide ($TiO_2$), or other suitable n-dipole materials. The dipole elements can be driven into the high-k dielectric layer 282, for example, by an annealing process. Once driven into the high-k dielectric layer 282, particularly in the inner portion of the high-k dielectric layer 282 near the interfacial dielectric layer 280, the n-dipole material can reduce the threshold voltage of the transistor 200B when it is an n-type transistor or increase the threshold voltage of the transistor 200B when it is a p-type transistor. In various embodiments, the dipole layer 220 may be deposited by ALD, CVD, PVD, thermal oxidation, or other suitable methods, and may be deposited at a temperate in a range from about 100° C. to about 450° C. at a pressure in a range from about 1 torr to about 100 torr. Further, the dipole layer 220 is deposited to a substantially uniform thickness in a range from about 0.5 Å to about 10 Å in various embodiments, such as from about 3 Å to about 5 Å. If the thickness is too small (such as less than 0.5 Å), the n-dipole layer 220 may be too weak for Vt tuning in some instances. If the thickness is too big (such as greater than 10 Å), the n-dipole layer 220 may be too strong for Vt tuning and may create side effects such as degraded mobility in the channel layers 215. Still further, the material and the thickness of the dipole layer 220 can be designed based on the desired amount of threshold voltage tuning. In some embodiment, a thicker dipole layer 220 leads to a greater change in the transistor 200B's threshold voltage. In various embodiments, using materials such as $La_2O_3$, $Y_2O_3$, or $TiO_2$ and the disclosed thickness above, the threshold voltage of the transistor 200B may be adjusted up (for p-type transistor) or down (for n-type transistor) in a range of about 20 mV to about 450 mV.

At the operation 116, the method 100 (FIG. 1B) forms another patterned hard mask 290 that covers the transistor 200B and exposes the transistor 200A. Referring to FIG. 9, the patterned hard mask 290 includes a material that is different than a material of the dipole layer 220 to achieve etching selectivity during the etching of the dipole layer 220. Further, the patterned hard mask 290 includes a material that is different than a material of the high-k dielectric layer 282 to achieve etching selectivity during the etching of the patterned hard mask 290. In some embodiments, the patterned hard mask 290 may include TiN, alumina, or other suitable materials. The formation of the patterned hard mask 290 may be substantially the same as that of the patterned hard mask 284 except that the patterned hard mask 290 covers the transistor 200B and the patterned hard mask 284 covers the transistor 200A. For example, the patterned hard mask 290 may be formed by deposition, photolithography, and etching processes like those discussed for the patterned hard mask 284.

At the operation 118, the method 100 (FIG. 1B) etches the dipole layer 220 and removes it from the transistors 200A while the patterned hard mask 290 covers the dipole layer 220 over the transistor 200B, such as shown in FIG. 10. The etching process completely removes the dipole layer 220 around the channel layers 215 and between the channel layers 215 and the substrate 202 in the transistor 200A, thereby exposing the high-k dielectric layer 282 therein. The etching process can be a dry etching process, a wet etching process, or a reactive ion etching process that has a high etching selectivity with respect to the dipole layer 220 relative to the high-k dielectric layer 282. In some embodiments, the etching process is a wet etching process that uses an etching solution having a high etching selectivity with respect to the dipole layer 220 relative to the high-k dielectric layer 282. For example, the etching selectivity can be about 10 to about 100 or can be greater than 100. Parameters of the etching process (such as etching temperature, etching solution concentration, etching time, other suitable wet etching parameters, or combinations thereof) are controlled to ensure complete removal of the dipole layer 220 in the transistor 200A. For example, an etching time (i.e., how long the dipole layer 220 is exposed to a wet etching solution) is tuned to completely remove the dipole layer 220 with minimal (to no) etching of high-k dielectric layer 282. In some embodiments, the etching solution further has an etching selectivity with respect to dipole layer 220 relative to the patterned hard mask 290. In some embodiments, the etching process partially etches the patterned hard mask 290.

Figures 11, 12:
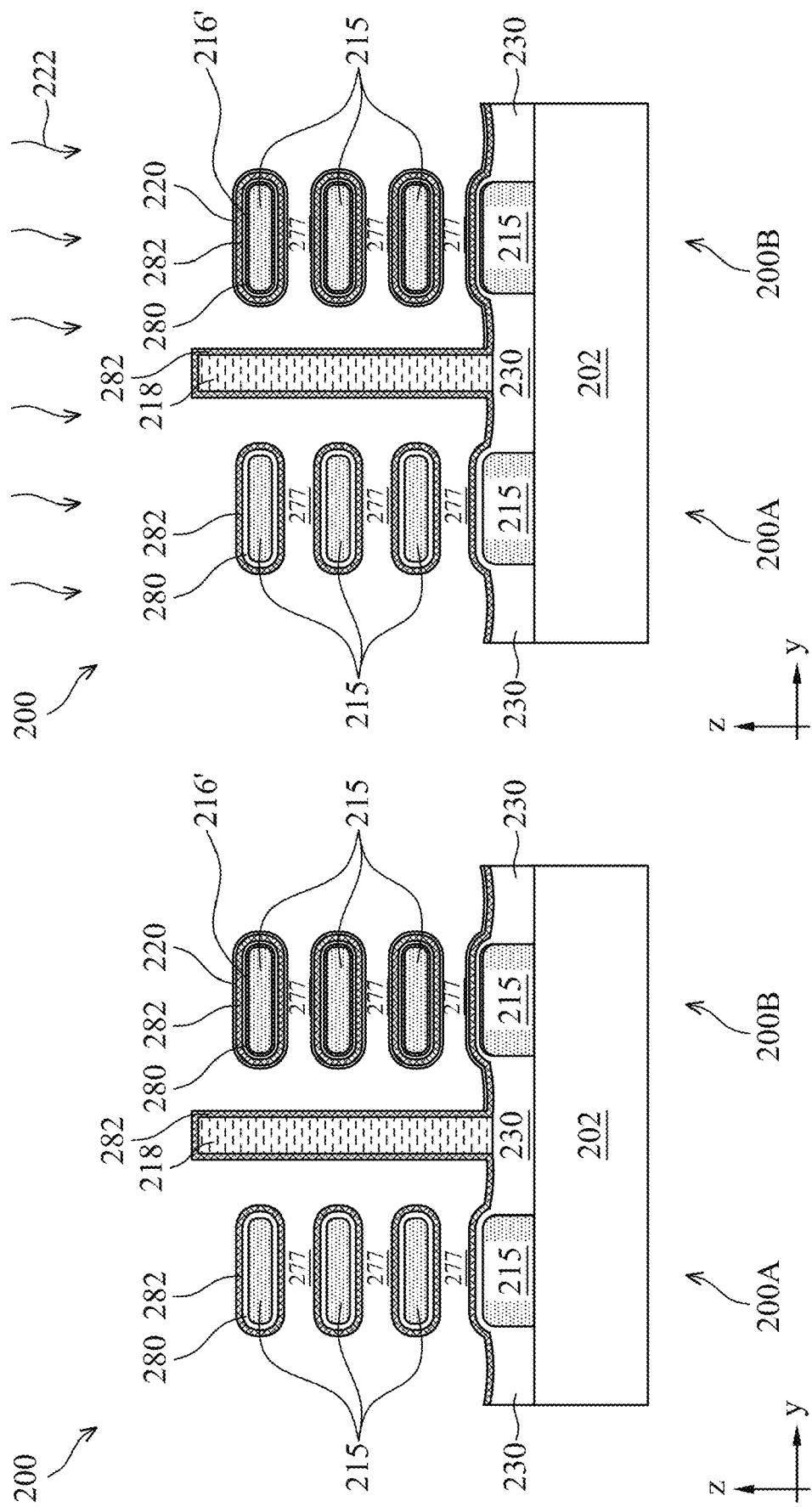

At the operation 120, the method 100 (FIG. 1B) removes the patterned hard mask 290, for example, using an etching process that has a high etching selectivity with respect to the patterned hard mask 290 relative to the high-k dielectric layer 282 and the dipole layer 220. In other words, the etching process completely removes the patterned hard mask 290 with little to no etching of the high-k dielectric layer 282 and the dipole layer 220. The etching process can be a dry etching process, a wet etching process, or a reactive ion etching process. After the operation 120 finishes, the dipole layer 220 is exposed in the transistor 200B while the high-k dielectric layer 282 is exposed in the transistor 200A, such as shown in FIG. 11. Some of the dipole layer 220 may remain on the dielectric fin 218, which has no effect to the subsequent fabrication.

At the operation 122, the method 100 (FIG. 1B) performs a thermal drive-in process 222, such as shown in FIG. 12. In an embodiment, the thermal drive-in process 222 is a spike anneal process or a soak anneal process at a temperature in a range from about 600° C. to about 1,000° C. with $O_2$, $N_2$, or a mixture of $O_2$ and $N_2$ ambient. In another embodiment, the thermal drive-in process 222 is a furnace anneal process at a temperature in a range from about 300° C. to about 600° C. with $O_2$, $N_2$, or a mixture of $O_2$ and $N_2$ ambient for about 30 minutes to about 3 hours. In yet another embodiment, the thermal drive-in process 222 is a laser anneal process or a microwave anneal process at a temperature in a range from about 800° C. to about 1,200° C. with $O_2$, $N_2$, $NH_3$, $H_2$, or a mixture thereof for about 1 millisecond to about 10 seconds. The above ranges of temperature are selected such that the process 222 does not adversely affect the existing structures and features of the device 200 and is yet sufficient to cause the dipole elements to migrate (or diffuse) from the dipole layer 220 into the high-k dielectric layer 282 thereunder. In an embodiment where the operation 106 omits a thermal drive-in process, the thermal drive-in process 222 also cause the dipole material to diffusion from the dipole layer 216' into the channel layers 215 thereunder. In the present embodiment, the thickness of the high-k dielectric layer 282 is designed so that the dipole materials can effectively permeate through the high-k dielectric layer 282. As shown in the boxed region 300 in FIG. 15, some dipole elements 220' are diffused into the inner portion of the high-k dielectric layer 282 that is near the interfacial dielectric layer 280, which will be further discussed.

Figures 13, 14:
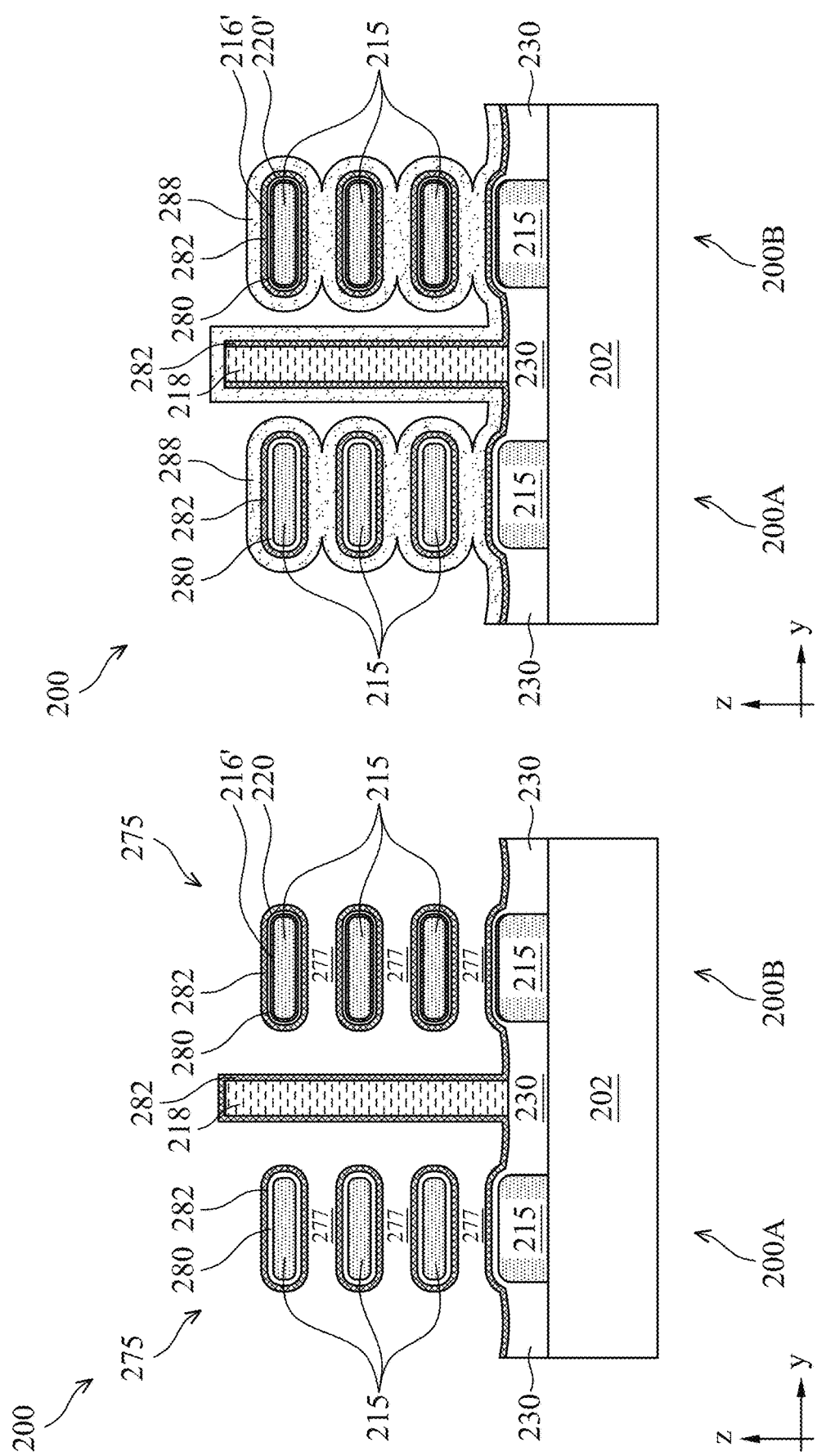

At operation 124, the method 100 (FIG. 1B) removes any remaining portions of the dipole layer 220 from the device 200 by applying one or more etching processes. The resultant structure is shown in FIG. 13. As noted above, some dipole elements 220' remain inside the high-k dielectric layer 282. The etching process can be a dry etching process, a wet etching process, a reactive ion etching process, or another etching process and has a high etching selectivity with respect to the dipole layer 220 relative to the high-k dielectric layer 282. The high-k dielectric layer 282 is exposed in the gate trenches 275 for both the transistors 200A and 200B after the operation 124 finishes.

At operation 126, the method 100 (FIG. 1B) forms a work function metal layer 288 over the transistors 200A and 200B, such as shown in FIG. 14. The work function metal layer 288 wraps around the high-k dielectric layer 282 over each of the channel layers 215. The work function metal layer 288 may completely or partially fill the gaps 277 in various embodiments. The work function metal layer 288 (in combination with the channel material(s) and dipole material(s)) is designed to provide a proper work function for the transistors 200A and 200B. In the present embodiment, the difference in the threshold voltages of the transistors 200A and 200B can be completely tuned by the dipole incorporation discussed above (such as incorporating the dipole elements 216' and 220' into the gate dielectric layers of the transistor 200B) so that a common work function metal layer 288 can be used for both transistors 200A and 200B. This obviates the need of using different work function metal layers for transistors 200A and 200B. Thus, embodiments of the present disclosure enable the use of thinner work function metal layer(s) for the device 200 than other approaches, and are suitable for miniaturized multi-gate devices, such as GAA devices. It is noted that the work function metal layer 288 may include multiple sub-layers, but it is still a common layer for both transistors 200A and 200B, where the transistors 200A and 200B may be of same conductivity type (both are NFET or both are PFET) or opposite conductivity types (one is NFET and the other is PFET).

In an embodiment, the work function metal layer 288 is free of aluminum. Aluminum tends to diffuse or migrate, which might cause degraded performance over time. Having no aluminum makes the work function metal layer 288 relatively more stable throughout the usable life of the device 200. In some embodiments, the work function metal layer 288 includes Ti, Ag, Mn, Zr, TiC, TaC, TaCN, TaSiN, TiSiN, TiN, TaN, Ru, Mo, WN, WCN, $ZrSi_2$, $MoSi_2$, $TaSi_2$, $NiSi_2$, other suitable work function metals, or a combination thereof. In some embodiments, the work function metal layer 288 has a thickness of about 2 nm to about 5 nm.

Figure 15:
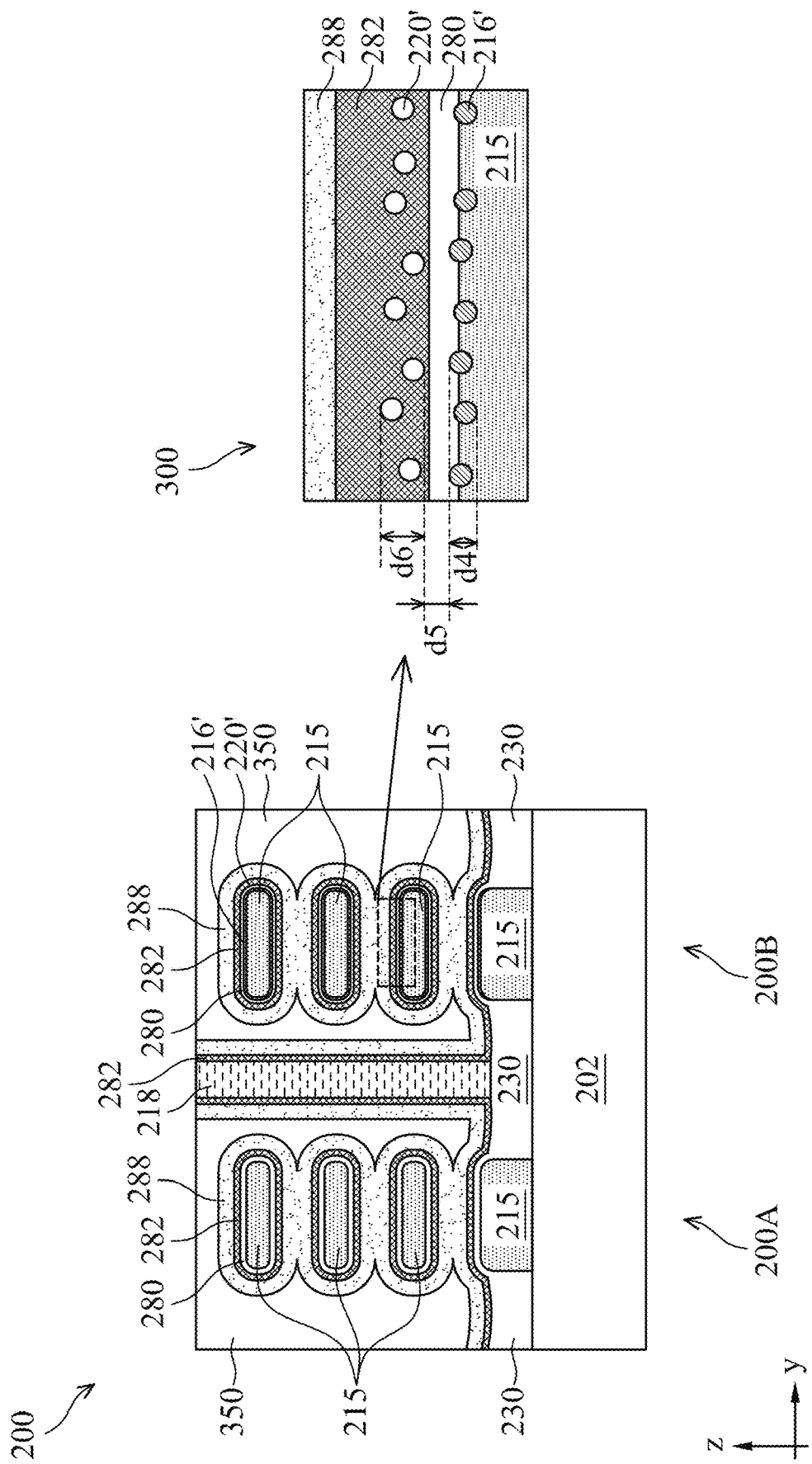

At operation 128, the method 100 (FIG. 1B) forms a gate electrode layer (or a bulk metal layer) 350 for each of the transistors 200A and 200B, such as shown in FIG. 15. For example, a CVD process or a PVD process deposits the bulk metal layer 350, such that it fills any remaining portion of gate trenches 275 (see FIGS. 2B, 2C, and 2D). The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a blocking layer (not shown) is optionally formed (e.g., by ALD) over the work function metal layer 288 before forming the bulk metal layer 350, such that the bulk metal layer 350 is disposed on the blocking layer. After the bulk metal layer 350 is deposited, a planarization process may then be performed to remove excess gate materials from the device 200. For example, a CMP process is performed until a top surface of ILD layer 270 (FIG. 2B) is exposed or until the dielectric fin 218 is exposed.

At operation 130, the method 100 (FIG. 1B) may perform other operations such as forming S/D contacts that electrically connect to the S/D features 260, forming gate vias that electrically connect to the bulk metal layer 350, and forming multi-layer interconnects that connect the transistors 200A and 200B to various parts of the device 200 to form a complete IC.

FIG. 15 illustrates an enlarged view of a block 300 which is part of the transistor 200B. Referring to FIG. 15, the transistor 200B in the depicted embodiment includes both p-dipole elements 216' and n-dipole elements 220'. The p-dipole elements 216' are distributed along the interface between the interfacial dielectric layer 280 and the channel layer 215. Some of the p-dipole elements 216' are distributed in an outer portion of the channel layers 215 and around an inner portion of the channel layers 215. Some of the p-dipole elements 216' are distributed in an inner portion of the interfacial dielectric layer 280. Stated differently, the interfacial dielectric layer 280 is disposed on the channel layer 215 and on the dipole elements 216'. The thickness of layers 215 and 280 where the p-dipole elements 216' are distributed has a thickness d4. In an embodiment, the thickness d4 is in a range of about 1 Å to 15 Å. If the thickness d4 is too small (such as less than 1 Å), the Vt tuning effect of the p-dipole elements 216' might be negligible (or too weak). If the thickness d4 is too large (such as more than 15 Å), the Vt tuning effect of the p-dipole elements 216' might be too strong and might cause side effects such as degraded mobility in the channel layers 215.

Still referring to FIG. 15, the n-dipole elements 220' are distributed along the interface between the interfacial dielectric layer 280 and the high-k dielectric layer 282. Majority of the n-dipole elements 220' are distributed in an inner portion of the high-k dielectric layer 282. Even though not shown, some of the n-dipole elements 220' may be distributed in an outer portion of the interfacial dielectric layer 280. Stated differently, the high-k dielectric layer 282 is disposed on the interfacial dielectric layer 280 and on the dipole elements 220'. The thickness of layers 280 and 282 where the n-dipole elements 220' are distributed has a thickness d6. In an embodiment, the thickness d6 is in a range of about 1 Å to 15 Å. If the thickness d6 is too small (such as less than 1 Å), the Vt tuning effect of the n-dipole elements 220' might be negligible (or too weak). If the thickness d6 is too large (such as more than 15 Å), the Vt tuning effect of the n-dipole elements 220' might be too strong and might cause side effects such as degraded mobility in the channel layers 215.

Still referring to FIG. 15, the n-dipole elements 220' and the p-dipole elements 216' are separated by a distance d5. In an embodiment, the distance d5 is in a range of about 5 Å to 30 Å. In various embodiment, the distance d5 may be smaller than, equal to, or greater than the thickness of the interfacial dielectric layer 280. If the distance d5 is too small (such as less than 5 Å), there is a risk that the n-dipole and p-dipole elements would mix together and would degrade the Vt tuning capability of the respective dipole elements. If the distance d5 is too large (such as more than 30 Å), the n-dipole elements 220' might be too far away from the channel layers 215, which would degrade the Vt tuning capability of the n-dipole elements. Thus, having the distance d5 in the disclosed range allows both the p-dipole elements and the n-dipole elements to co-exist and each perform their intended Vt tuning function.

Figure 16:
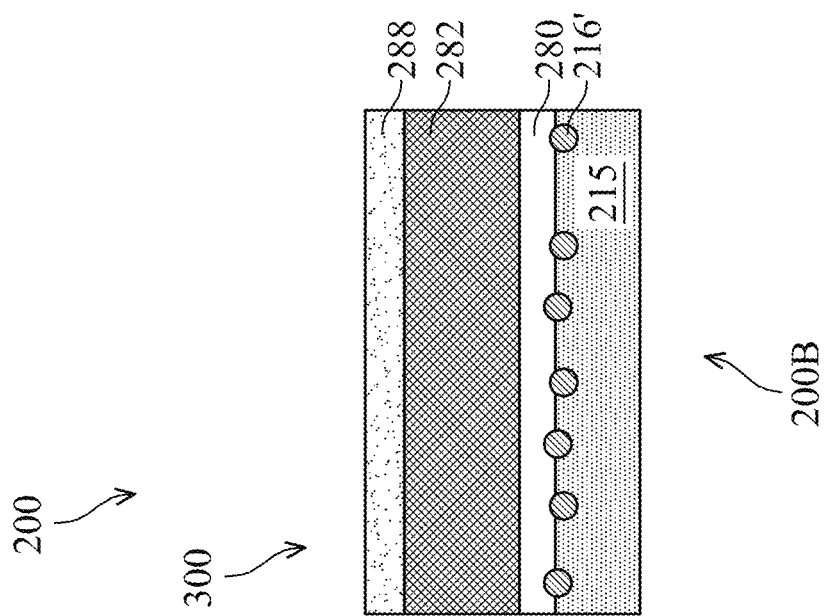

In the embodiment depicted in FIG. 15, the transistor 200B incorporates both p-dipole elements and n-dipole elements. In an alternative embodiment, the transistor 200B may incorporate p-dipole elements but not n-dipole elements, such as shown in FIG. 16. For purposes of simplicity, FIG. 16 only shows the block 300 of the transistor 200B (see the location of the block 300 in FIG. 15) and omits other features of the transistor 200B. As shown in FIG. 16, p-dipole elements 216' are included in the channel layer 215 and/or the interfacial dielectric layer 280, and the n-dipole elements 220' are not included in the high-k dielectric layer 282. To realize this embodiment, some of the operations of the method 100 discussed above may be omitted. For example, the operations 114, 116, 118, 120, 122, and 124 may be omitted in an embodiment of the method 100 to fabricate a transistor as shown in FIG. 16.

Figure 17:
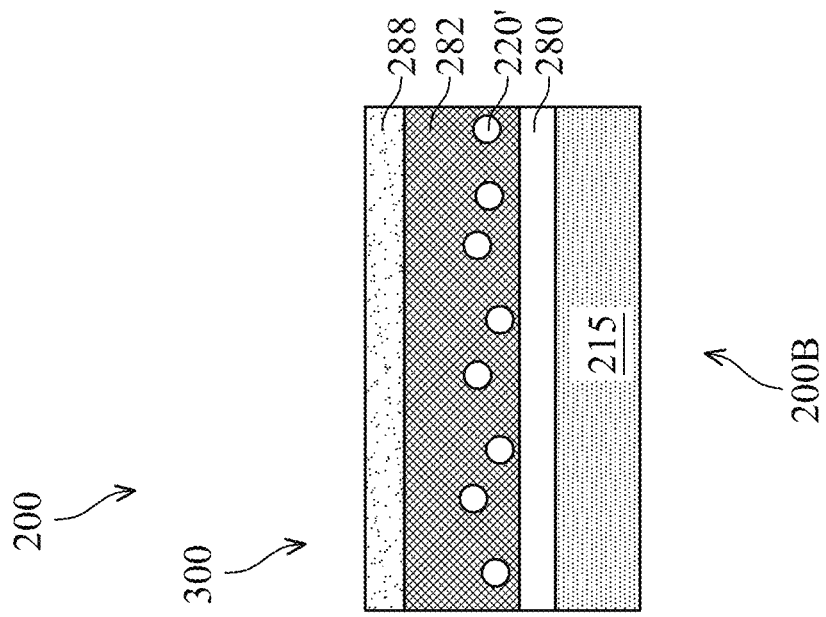
FIGS. 16 and 17 show diagrammatic cross-sectional views of the CMOS device in FIG. 2A, in portion, according to some aspects of the present disclosure.

In another alternative embodiment, the transistor 200B may incorporate n-dipole elements but not p-dipole elements, such as shown in FIG. 17. For purposes of simplicity, FIG. 17 only shows the block 300 of the transistor 200B (see the location of the block 300 in FIG. 15) and omits other features of the transistor 200B. As shown in FIG. 17, p-dipole elements 216' are not included in the channel layer 215 or the interfacial dielectric layer 280, and the n-dipole elements 220' are included in the high-k dielectric layer 282. To realize this embodiment, some of the operations of the method 100 discussed above may be omitted. For example, the operations 104, 106, and 108 may be omitted in an embodiment of the method 100 to fabricate a transistor as shown in FIG. 17. It is noted that when the operation 106 is omitted, the operation 110 will not form the p-dipole layer or p-dipole elements.

In yet another alternative embodiment, the order of the operations 114, 116, 118, and 120 may be altered. For example, before forming the n-dipole layer 220, the method 100 may perform operation 116 to form a patterned hard mask 290' covering the transistor 200A and leaving the transistor 200B exposed. Then, the method may perform operation 114 to selectively deposit the dipole layer 220 on the transistor 200B. Thereafter, the method may perform operation 120 to selectively remove the patterned hard mask 290'.

In yet another alternative embodiment, some operations of the method 100 may be repeated to reach a desired Vt tuning. For example, an embodiment of the method 100 may repeat the operations 114 (n-dipole deposition) through 122 (thermal drive-in) to incrementally increase or decrease the threshold voltage of the transistor 200B. For example, in a first iteration (of the operations 114 through 122), the operation 114 may perform atomic layer deposition of $La_2O_3$ for 4 cycles, which may adjust the Vt of the transistor 200B by 45 mV once the first iteration finishes. Then, in a second iteration (of the operations 114 through 122), the operation 114 may perform atomic layer deposition of $La_2O_3$ for 8 cycles, which may adjust the Vt of the transistor 200B by another 90 mV once the second iteration finishes. By using the two iterations, the Vt of the transistor 200B may be adjusted 135 mV total.

Figure 18:
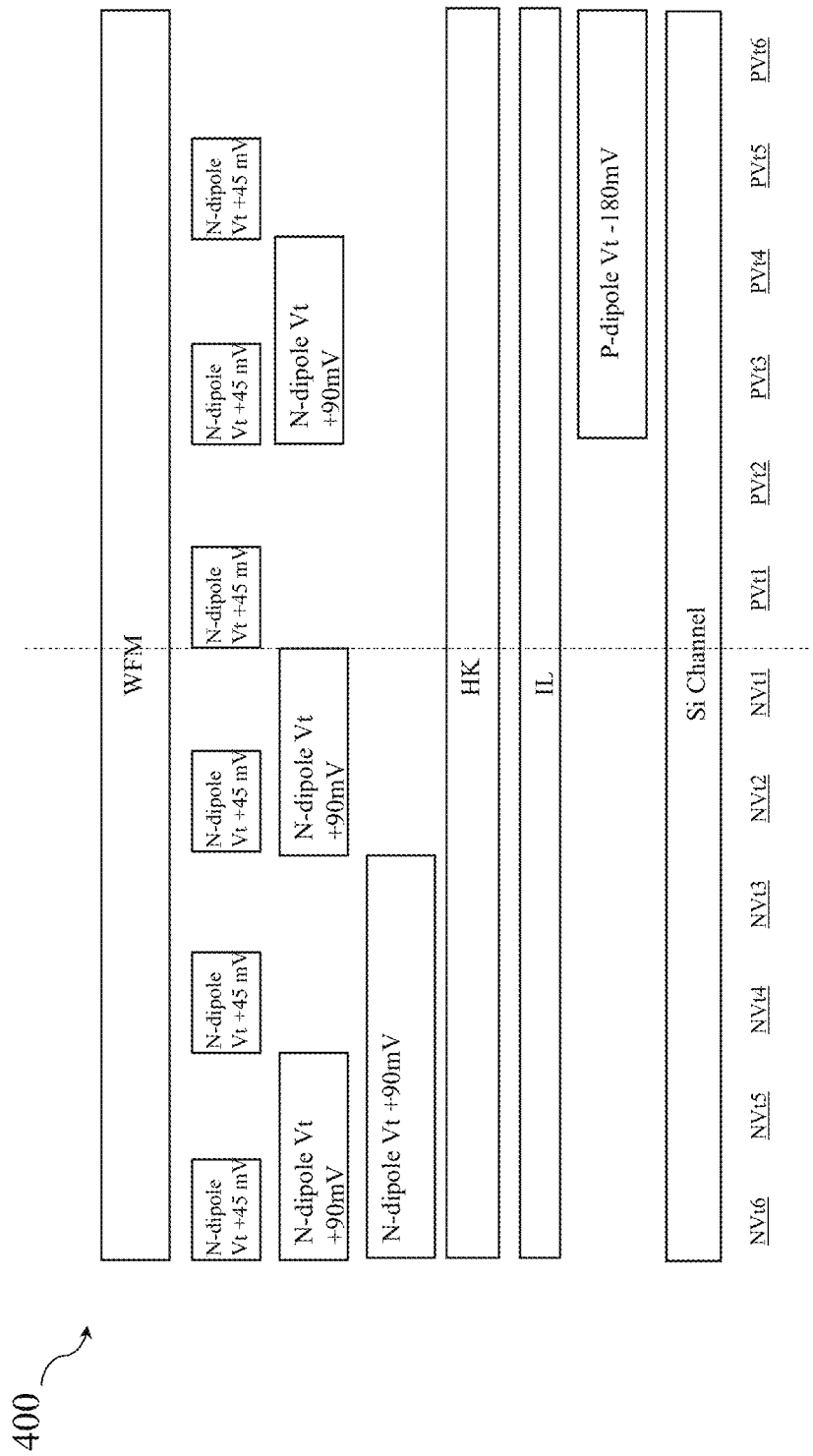
FIG. 18 shows a schematic diagram of various threshold voltages tunable according to some embodiments of the present disclosure.

FIG. 18 shows a chart 400 illustrating the Vt tuning capability according to an embodiment of the method 100. In this embodiment, transistors in a device (such as the device 200) are provided with 6 different threshold voltages for NFET (NVt1~6) and 6 different threshold voltages for PFET (PVt1~6). In this example, the p-dipole incorporation adjusts the threshold voltage of a PFET by −180 mV, while one or more n-dipole incorporation adjust the threshold voltage of a PFET by +45 mV, +90 mV, or +180 mV. In this example, PVt2 is a base line threshold voltage where neither p-dipole nor n-dipole is incorporated. The threshold voltage PVt6 is achieved by incorporating p-dipole only, the threshold voltages NVt1~6 are achieved by incorporating n-dipole only, and the threshold voltages PVt3~5 are achieved by incorporating both p-dipole and n-dipole. Taking PVt5 as an example, the transistor has both p-dipole and n-dipole incorporation and its threshold voltage is adjusted a total of −135 mV. The threshold voltage NVt6 is achieved by incorporating n-dipole elements using three iterations (45 mV, 90 mV, and 180 mV respectively) as discussed above. The threshold voltages NVt5, NVt4, and NVt2 are achieved by incorporating n-dipole elements using two iterations as discussed above. The threshold voltages NVt3, NVt1, and PVt1 are achieved by incorporating n-dipole elements using one iteration as discussed above. The threshold voltage PVt3 is achieved by incorporating n-dipole elements using two iterations as discussed above and incorporating p-dipole elements. The threshold voltages PVt4 and PVt5 are achieved by incorporating n-dipole elements using one iteration as discussed above and incorporating p-dipole elements.

Figure 19:
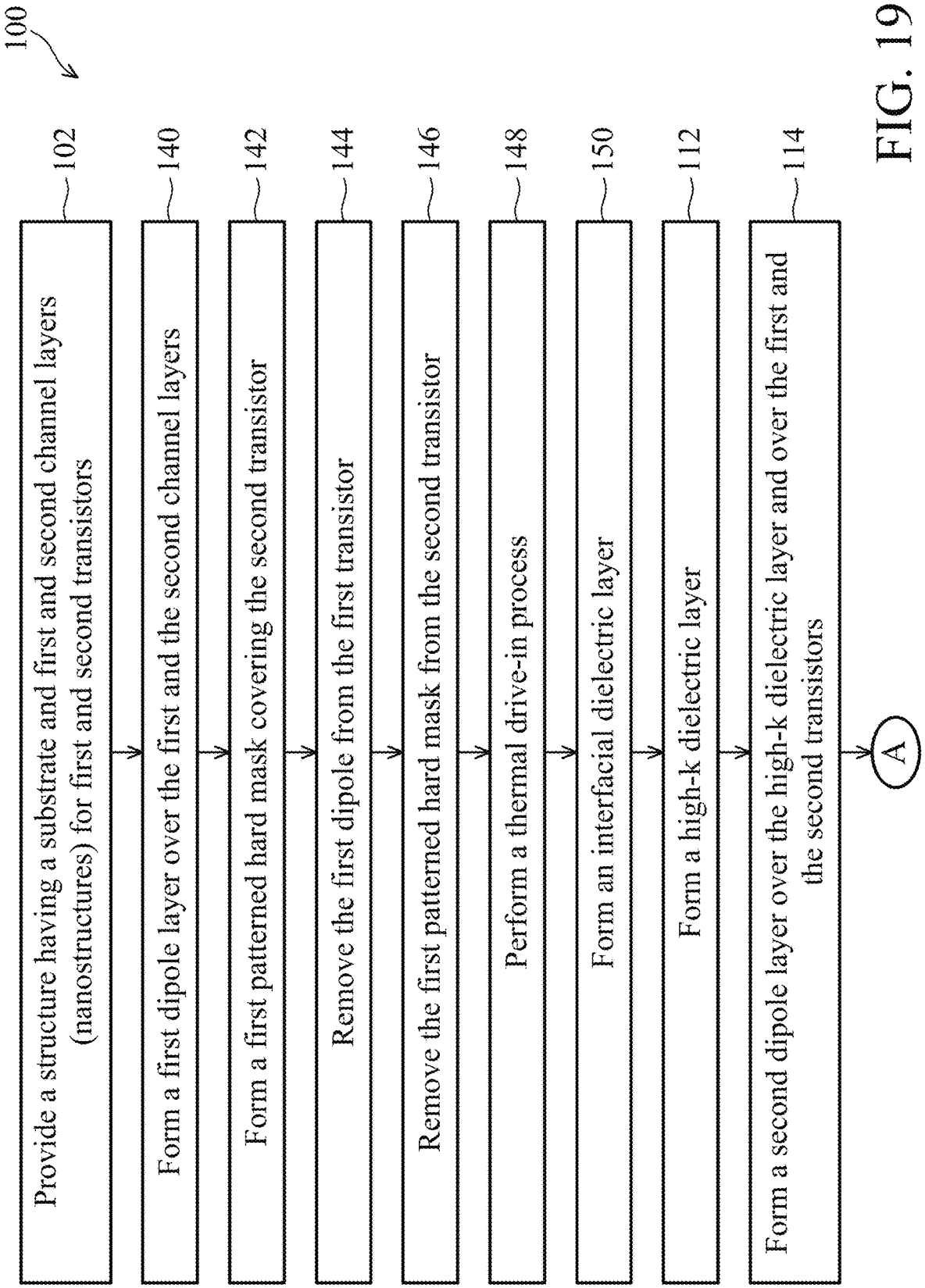
FIG. 19 shows a flow chart of a method for fabricating a CMOS device according to various aspects of the present disclosure.

FIGS. 19 and 1B show a flow chart of an alternative embodiment of the method 100, which is described below in conjunction with FIGS. 20 through 26.

At operation 102, the method 100 (FIG. 19) provides an initial structure of the CMOS device 200, a portion of which is shown in FIGS. 2A-2D. This operation has been discussed above.

At operation 140, the method 100 (FIG. 19) forms a dipole layer 216' over the channel layers 215 for both the transistors 200A and 200B, as well as over the dielectric fin 218 and the isolation features 230, such as shown in FIG. 20. The dipole layer 216' includes a p-dipole material such as germanium oxide, aluminum oxide, gallium oxide, zinc oxide, or other p-dipole material, and may be deposited using ALD, PVD, CVD, or other suitable deposition processes.

At operation 142, the method 100 (FIG. 19) forms a patterned hard mask 292 that covers the transistor 200B and exposes the transistor 200A, such as shown in FIG. 21. The patterned hard mask 292 may be formed by deposition, photolithography, and etching processes, such as those discussed above for the patterned hard mask 284. For example, the patterned hard mask 292 may include a sacrificial layer, a BARC layer, and a photoresist.

At operation 144, the method 100 (FIG. 19) etches the dipole layer 216' using the patterned hard mask 292 as an etch mask, thereby removing the dipole layer 216' from the transistor 200A, such as shown in FIG. 22. The etching process may be dry etching, wet etching, reactive ion etching, or other suitable process. The etching process is tuned to selectively remove the dipole layer 216' and with little to no etching to the channel layers 215, the dielectric fin 218, and the isolation features 230.

At operation 146, the method 100 (FIG. 19) removes the patterned hard mask 292, such as shown in FIG. 23. The patterned hard mask 292 may be removed by an etching process that is tuned to selectively remove the patterned hard mask 292 with little to no etching to the dielectric fin 218, the isolation features 230, the channel layers 215, and the dipole layer 216'. The etching process may include a wet etching process, a dry etching process, or other suitable etching processes.

At operation 148, the method 100 (FIG. 19) performs a thermal drive-in process so that some elements from the dipole layer 216' are driven into the outer portion of the channel layers 215. The aspects of the operation 148 are similar to those of the operation 107. In some embodiment, the operation 148 is omitted in the method 100.

At the operation 150, the method 100 (FIG. 19) forms an interfacial dielectric layer 280 wrapping around the channel layers 215 in the transistor 200A and wrapping around the dipole layer 216' in the transistor 200B, such as shown in FIG. 24. The interfacial dielectric layer 280 may be deposited using ALD, CVD, or other suitable process. In embodiments, the interfacial dielectric layer 280 includes a dielectric material, such as $SiO_2$, HfSiO, SiON, other silicon-containing dielectric material, other suitable dielectric material, or combinations thereof.

Figure 26:
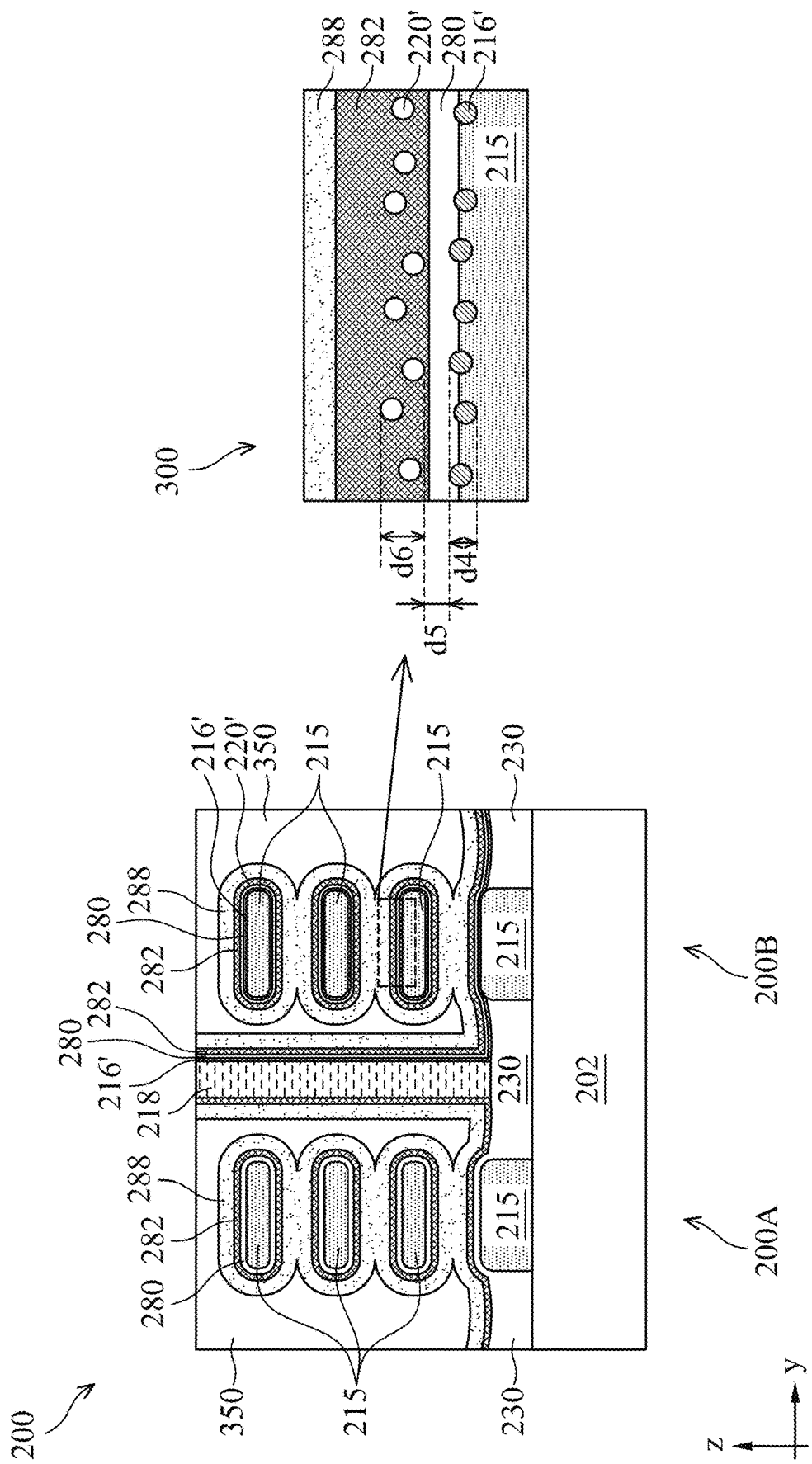

At the operation 112, the method 100 (FIG. 19) forms a high-k dielectric layer 282 over the interfacial layer 280, such as shown in FIG. 25. This operation has been described above with reference to FIG. 1A and FIG. 7. Subsequently, the method 100 performs operations 114 through 130 as shown in FIGS. 1A and 1B and as discussed above. For example, the method 100 forms a dipole layer 220 over the high-k dielectric layer 282 (operation 114, FIG. 8), forms a pattern hard mask covering the transistor 200B (operation 116, FIG. 9), removes the dipole layer 220 from the transistor 200A (operation 118, FIG. 10), removes the patterned hard mask (operation 120, FIG. 11), performs a thermal drive-in process (operation 122, FIG. 12), removes the remaining portions of the dipole layer 220 from the transistor 200B (operation 124, FIG. 13), forms a work function metal layer in the transistors 200A and 200B (operation 126, FIG. 14), forms a gate electrode layer 350 (operation 128, FIG. 26), and performs further fabrication (operation 130). FIG. 26 illustrates the device 200 after the operation 128 has completed according to the embodiment of the method 100 shown in FIGS. 19 and 1B. This also achieves tuning the threshold voltage of the transistor 200B using both n-dipole and p-dipole materials.

Figure 27:
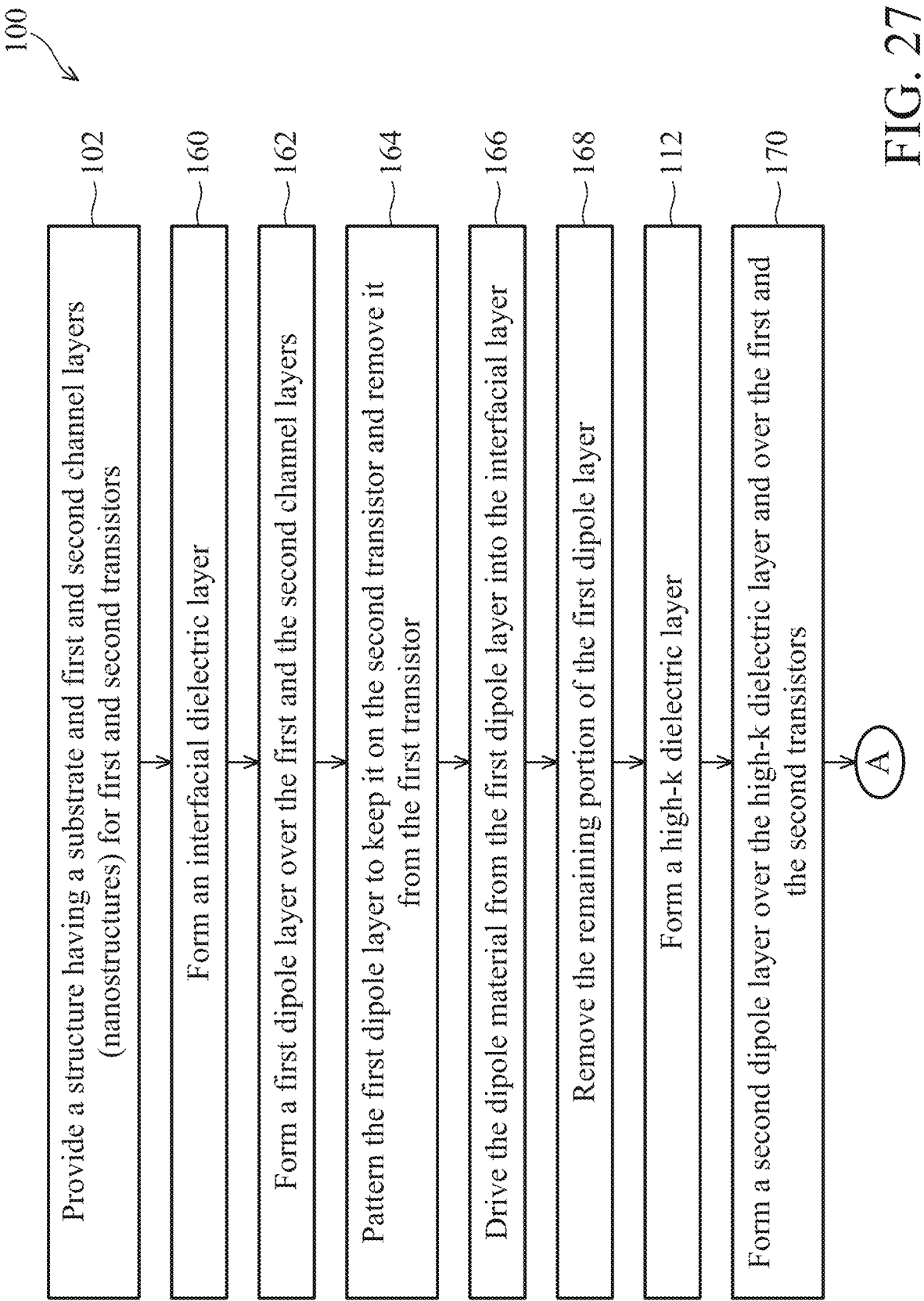
FIG. 27 shows a flow chart of a method for fabricating a CMOS device according to various aspects of the present disclosure.

FIGS. 27 and 1B show a flow chart of another alternative embodiment of the method 100, which is described below in conjunction with FIGS. 28 through 36.

At operation 102, the method 100 (FIG. 27) provides an initial structure of the CMOS device 200, a portion of which is shown in FIGS. 2A-2D. This operation has been discussed above.

Figures 28, 29:
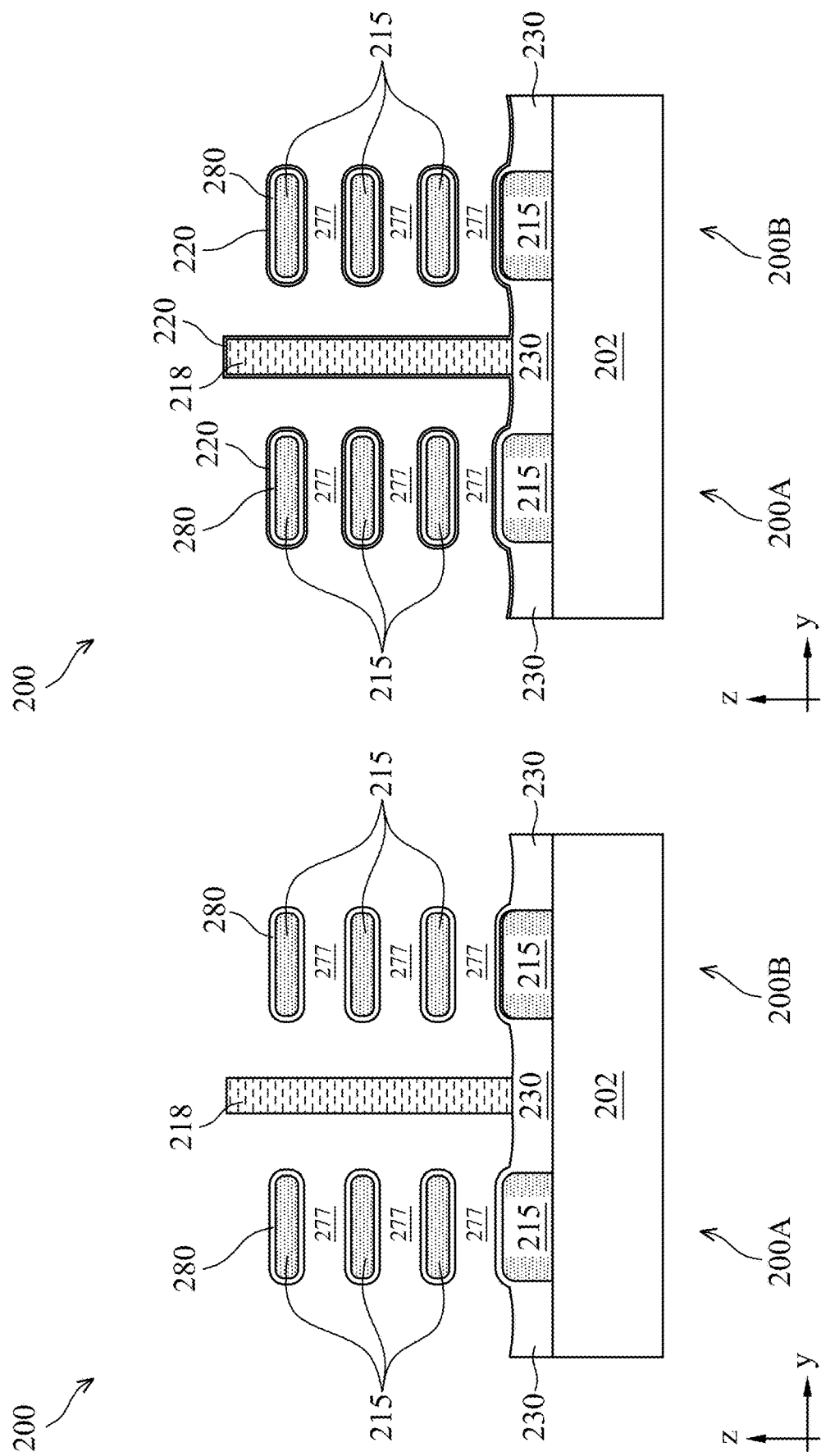
FIGS. 28, 29, 30, 31, 32, 33, 34, 35, and 36 are diagrammatic cross-sectional views of the CMOS device in FIG. 2A, in portion, at various fabrication stages (such as those associated with the method in FIGS. 27 and 1B) according to various aspects of the present disclosure.

At the operation 160, the method 100 (FIG. 27) forms an interfacial dielectric layer 280 wrapping around the channel layers 215 in the transistors 200A and 200B, such as shown in FIG. 28. In embodiments, the interfacial dielectric layer 280 includes a dielectric material, such as $SiO_2$, HfSiO, SiON, other silicon-containing dielectric material, other suitable dielectric material, or combinations thereof. In embodiments, the interfacial layer 280 is formed by any of the processes described herein, such as thermal oxidation, chemical oxidation, ALD, CVD, other suitable process, or combinations thereof.

At the operation 162, the method 100 (FIG. 27) forms a dipole layer 220 over the interfacial layer 280, such as shown in FIG. 29. The aspects of the operation 162 are similar to those of the operation 114. For example, the dipole layer 220 includes an n-dipole material such as lanthanum oxide ($La_2O_3$), yttrium oxide ($Y_2O_3$), titanium oxide ($TiO_2$), or other suitable n-dipole materials, and may be deposited by ALD, CVD, PVD, thermal oxidation, or other suitable methods.

Figures 30, 31:
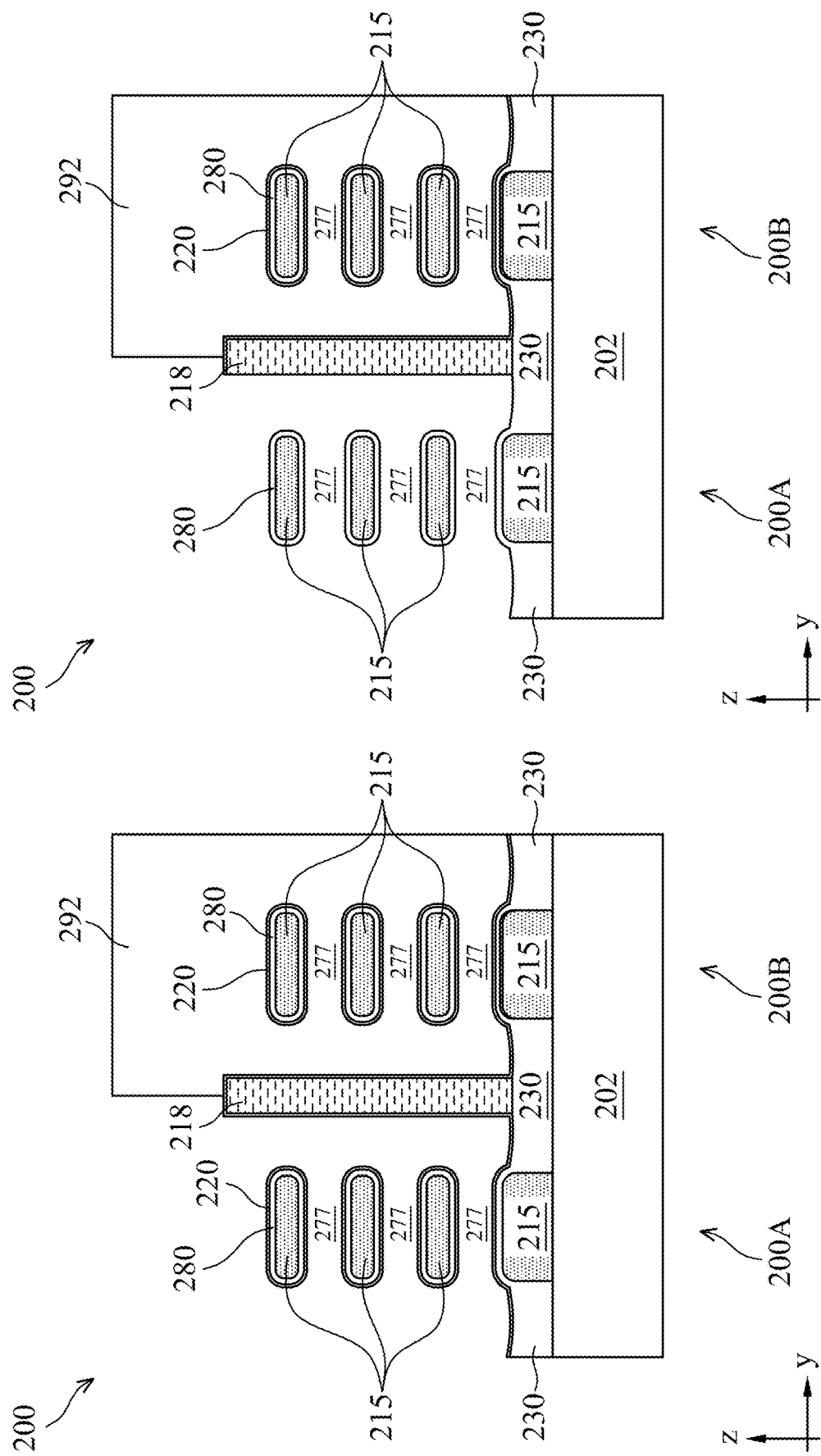
Figures 32, 33:
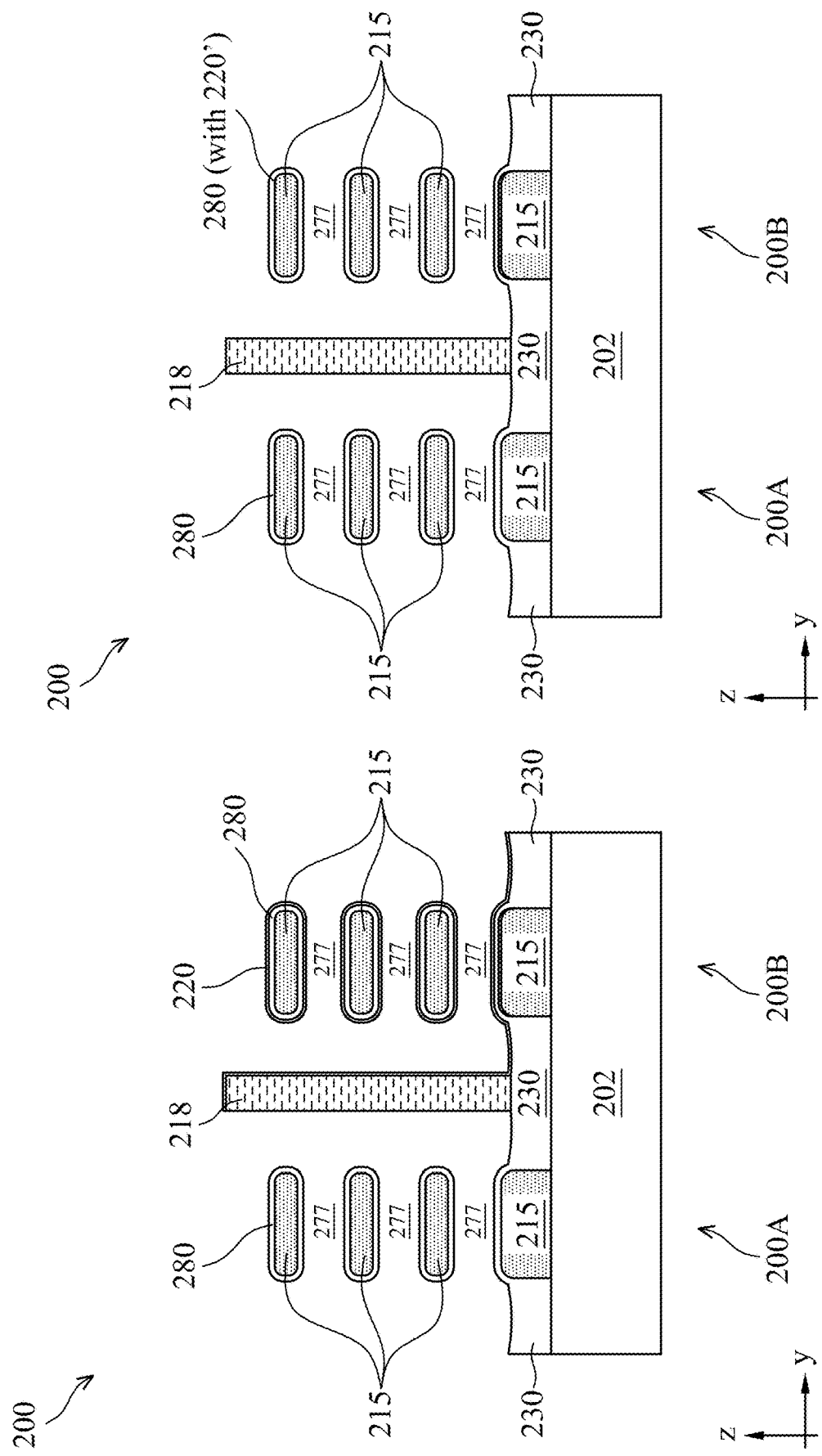

At the operation 164, the method 100 (FIG. 27) patterns the dipole layer 220 such that it is removed from the transistor 200A and is kept over the transistor 200B. This may involve a variety of processes such as lithography and etching processes. For example, the operation 164 may form a patterned hard mask 292 that covers the transistor 200B and exposes the transistor 200A, such as shown in FIG. 30. This aspect is similar to the operation 142. Then, the operation 164 etches the dipole layer 220 using the patterned hard mask 292 as an etch mask, thereby removing the dipole layer 220 from the transistor 200A, such as shown in FIG. 31. The etching process may be dry etching, wet etching, reactive ion etching, or other suitable process. The etching process is tuned to selectively remove the dipole layer 220 and with little to no etching to the channel layers 215, the dielectric fin 218, and the isolation features 230. Then, the operation 164 removes the patterned hard mask 292, such as shown in FIG. 32. The patterned hard mask 292 may be removed by an etching process that is tuned to selectively remove the patterned hard mask 292 with little to no etching to the dielectric fin 218, the isolation features 230, the channel layers 215, and the dipole layer 220. The etching process may include a wet etching process, a dry etching process, or other suitable etching processes.

At operation 166, the method 100 (FIG. 27) performs a thermal drive-in process so that some elements from the dipole layer 220 are driven into the interfacial layer 280. The aspects of the operation 166 are similar to those of the operation 107. In some embodiment, the operation 166 is omitted in the method 100.

At operation 168, the method 100 (FIG. 27) removes the remaining portion of the dipole layer 220 that are not driven into the interfacial layer 280, such as shown in FIG. 33. The operation 168 may apply one or more etching processes. The etching process can be a dry etching process, a wet etching process, a reactive ion etching process, or another etching process and has a high etching selectivity with respect to the dipole layer 220 relative to the interfacial layer 280. As illustrated in FIG. 33, the interfacial layer 280 of the transistor 200B now includes dipole material 220' from the dipole layer 220.

Figures 34, 35:
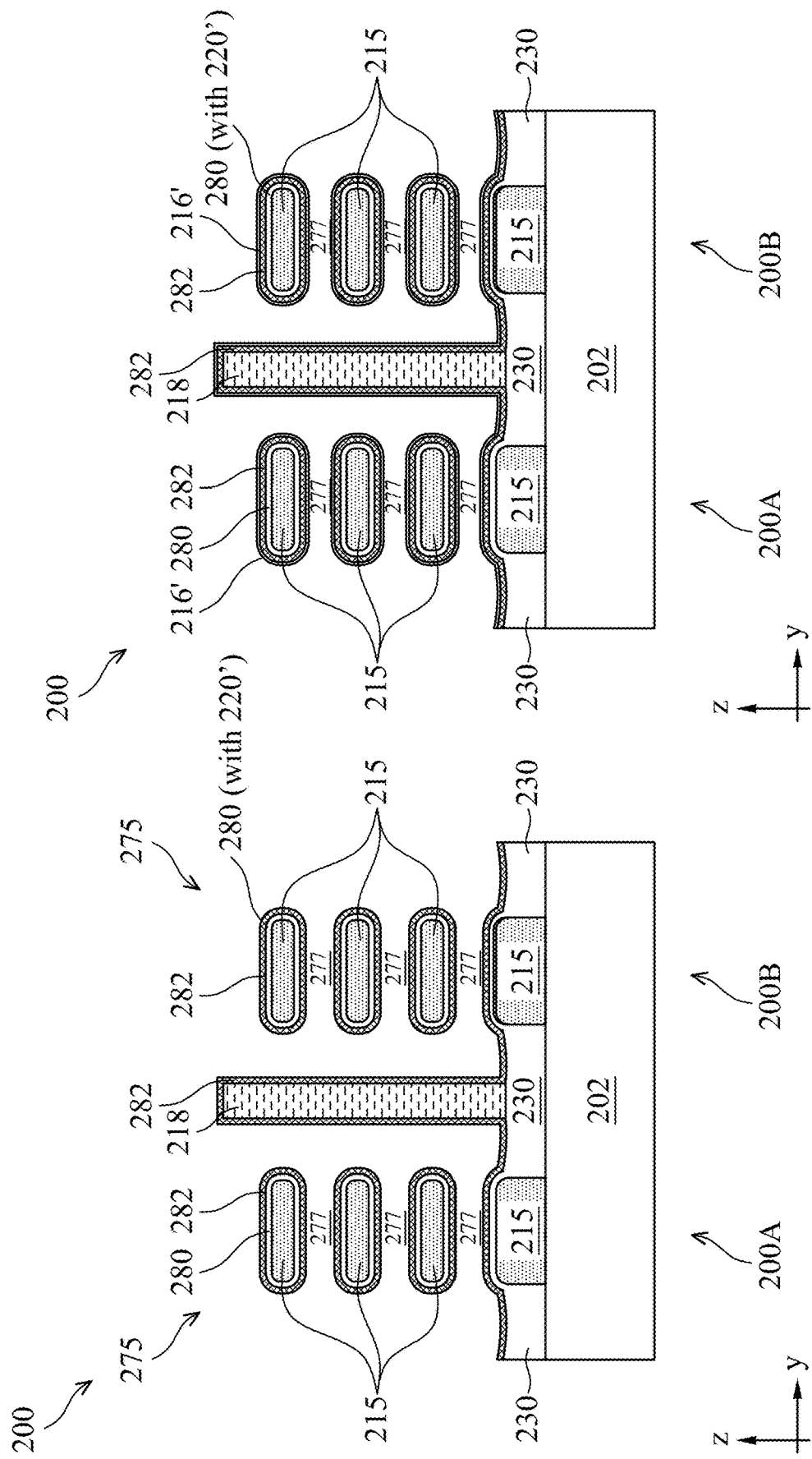

At the operation 112, the method 100 (FIG. 27) forms a high-k dielectric layer 282 over the interfacial layer 280, such as shown in FIG. 34. This operation has been described above with reference to FIG. 1A and FIG. 7.

Figure 36:
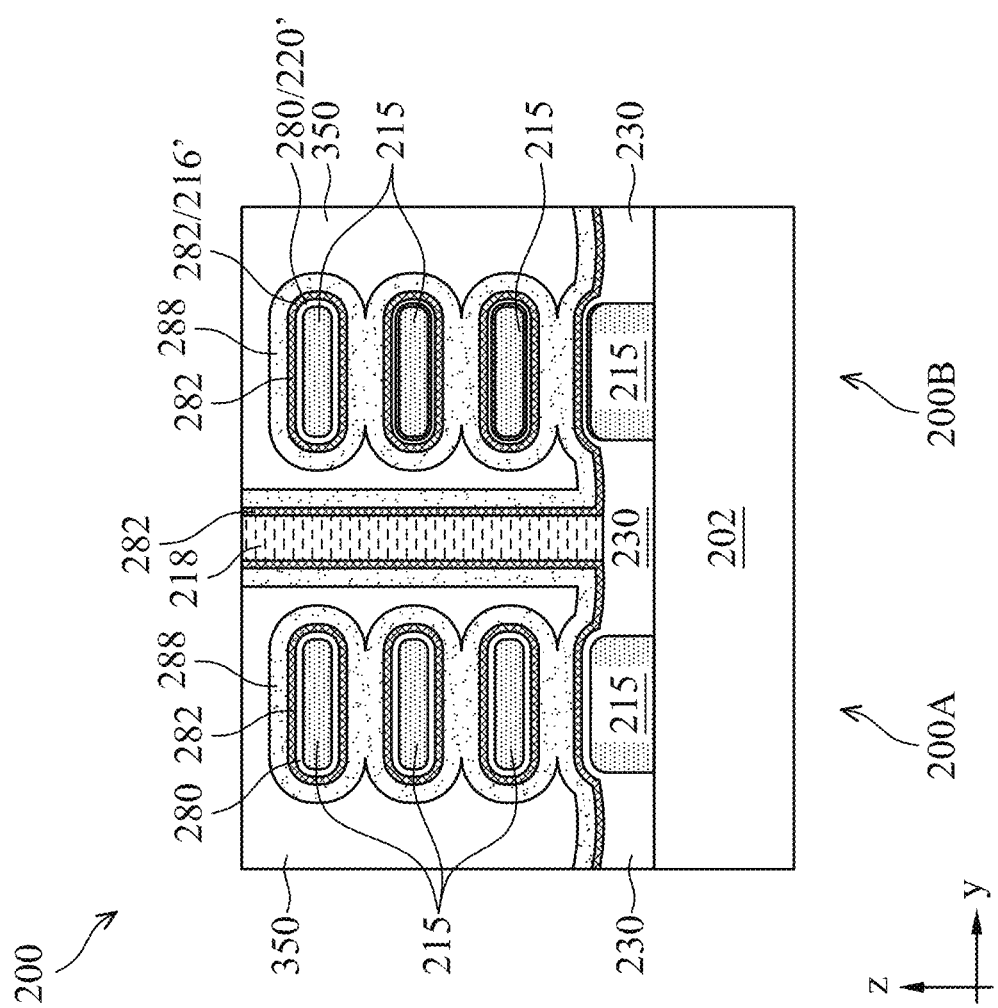

At the operation 170, the method 100 (FIG. 27) forms a dipole layer 216' over the high-k dielectric layer 282, such as shown in FIG. 35. The dipole layer 216' includes a p-dipole material such as germanium oxide, aluminum oxide, gallium oxide, zinc oxide, or other p-dipole material, and may be deposited using ALD, PVD, CVD, or other suitable deposition processes. Subsequently, the method 100 performs operations 116 through 130 as shown in FIG. 1B and as discussed above. For example, the method 100 forms a pattern hard mask covering the transistor 200B (operation 116, FIG. 9), removes the dipole layer 216' from the transistor 200A (operation 118, FIG. 10), removes the patterned hard mask (operation 120, FIG. 11), performs a thermal drive-in process (operation 122, FIG. 12), removes the remaining portions of the dipole layer 216' from the transistor 200B (operation 124, FIG. 13), forms a work function metal layer in the transistors 200A and 200B (operation 126, FIG. 14), forms a gate electrode layer 350 (operation 128, FIG. 36), and performs further fabrication (operation 130). FIG. 36 illustrates the device 200 after the operation 128 has completed according to the embodiment of the method 100 shown in FIGS. 27 and 1B. As shown in FIG. 36, the interfacial layer 280 (particular the portion of the interfacial layer 280 near the high-k dielectric layer 282) includes n-dipole materials 220', while the high-k dielectric layer 282 (particularly the portion of the high-k dielectric layer 282 near the work function metal layer 288) includes p-dipole materials 216'. This also achieves tuning the threshold voltage of the transistor 200B using both n-dipole and p-dipole materials.

Although not intended to be limiting, one or more embodiments of the present disclosure provide many benefits to a semiconductor device and the formation thereof. For example, embodiments of the present disclosure provide a process for incorporating p-dipole elements and/or n-dipole elements into gate dielectric layers of transistors, thereby offering great variety and flexibility in transistors' threshold voltages. Using the present disclosure obviates the need of patterning work function metal layer(s), making it very suitable for nanosized transistors and enabling continued downscaling. Having the ability to fine tune the threshold voltages means that the transistors can be provided with reduced threshold voltages and faster operating speed. The present embodiments can be readily integrated into existing CMOS fabrication processes.

In one example aspect, the present disclosure is directed to a method that includes providing semiconductor channel layers over a substrate; forming a first dipole layer wrapping around the semiconductor channel layers; forming an interfacial dielectric layer wrapping around the first dipole layer; forming a high-k dielectric layer wrapping around the interfacial dielectric layer; forming a second dipole layer wrapping around the high-k dielectric layer; performing a thermal process to drive at least some dipole elements from the second dipole layer into the high-k dielectric layer; removing the second dipole layer; and forming a work function metal layer wrapping around the high-k dielectric layer.

In some embodiment of the method, the first dipole layer includes a p-dipole material and the second dipole layer includes an n-dipole material. In a further embodiment, the first dipole layer includes germanium oxide, aluminum oxide, gallium oxide, or zinc oxide. In another further embodiment, the second dipole layer includes lanthanum oxide, yttrium oxide, or titanium oxide.

In some embodiment of the method, the work function metal layer is free of aluminum. In a further embodiment, the work function metal layer includes titanium nitride, tantalum nitride, tungsten carbonitride, or titanium silicon nitride.

In another example aspect, the present disclosure is directed to a method. The method includes providing first channel layers and second channel layers over a substrate; forming a first dipole layer wrapping around the second channel layers but not the first channel layers; forming an interfacial dielectric layer wrapping around the first dipole layer and the first channel layers; forming a high-k dielectric layer wrapping around the interfacial dielectric layer; forming a second dipole layer wrapping around the high-k dielectric layer over the second channel layers but not the high-k dielectric layer over the first channel layers; performing a thermal process to drive at least some dipole elements from the second dipole layer into the high-k dielectric layer over the second channel layers; removing the second dipole layer; and forming a work function metal layer wrapping around the high-k dielectric layer over both the first and the second channel layers.

In an embodiment, the method further includes forming a gate electrode layer over the work function metal layer over both the first and the second channel layers. In a further embodiment, the work function metal layer fills gaps between adjacent first channel layers, fills gaps between adjacent second channel layers, and is free of aluminum.

In an embodiment of the method, the first dipole layer includes germanium oxide, aluminum oxide, gallium oxide, or zinc oxide. In another embodiment, the second dipole layer includes lanthanum oxide, yttrium oxide, or titanium oxide.

In an embodiment of the method, the forming of the first dipole layer and the forming of the interfacial dielectric layer include forming a patterned hard mask covering the first channel layers and exposing the second channel layers; selectively depositing a cladding layer over the second channel layers but not over the patterned hard mask; selectively removing the patterned hard mask but not the cladding layer; and performing a cleaning process with an oxygen-containing cleaning solution to the first channel layers, the cladding layer, and the second channel layers, resulting in the first dipole layer wrapping around the second channel layers and the interfacial dielectric layer wrapping around the first channel layers and the first dipole layer. In a further embodiment, the first and the second channel layers include crystalline silicon, the cladding layer include germanium, the first dipole layer includes germanium dioxide, and the interfacial dielectric layer includes silicon dioxide. In another further embodiment, the oxygen-containing cleaning solution includes standard clean 1 (SC1) solution or standard clean 2 (SC2) solution.

In an embodiment of the method, the forming of the second dipole layer includes depositing the second dipole layer wrapping around the high-k dielectric layer over both the first and the second channel layers; forming a patterned hard mask covering the second dipole layer over the second channel layers and exposing the second dipole layer over the first channel layers; selectively removing the second dipole layer over the first channel layers to expose the high-k dielectric layer over the first channel layers; and selectively removing the patterned hard mask to expose the second dipole layer over the second channel layers.

In yet another example aspect, the present disclosure is directed to a semiconductor structure that includes a substrate; semiconductor channel layers over the substrate; a p-dipole material around the semiconductor channel layers; an interfacial dielectric layer over the p-dipole material and the semiconductor channel layers; an n-dipole material over the interfacial dielectric layer; a high-k dielectric layer over the n-dipole material and the interfacial dielectric layer; and a work function metal layer over the high-k dielectric layer and wrapping around each of the semiconductor channel layers.

In an embodiment of the semiconductor structure, the semiconductor channel layers include crystalline silicon and the p-dipole material includes germanium, aluminum, gallium, or zinc. In a further embodiment, the interfacial dielectric layer includes silicon dioxide and the n-dipole material includes lanthanum, yttrium, or titanium.

In another embodiment of the semiconductor structure, the work function metal layer is substantially free of aluminum. In another embodiment, the semiconductor structure further includes a gate electrode layer over the work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a first channel layer of a first transistor and a second channel layer of a second transistor over a substrate;
    forming a dipole layer over the first channel layer and the second channel layer, wherein the dipole layer includes a p-dipole material;
    forming a patterned hard mask covering the second channel layer and exposing the first channel layer;
    removing the dipole layer from the first channel layer;
    removing the patterned hard mask;
    performing a thermal drive-in process;
    forming an interfacial dielectric layer on the first channel layer and the dipole layer; and
    forming a high-k dielectric layer on the interfacial dielectric layer.

2. The method of claim 1, wherein the dipole layer includes germanium oxide, aluminum oxide, gallium oxide, zinc oxide, or a combination thereof.

3. The method of claim 1, wherein performing the thermal drive-in process drives dipole elements from the dipole layer into outer portions of the second channel layer.

4. The method of claim 1, wherein the dipole layer is a first dipole layer, the patterned hard mask is a first patterned mask, and the thermal drive-in process is a first thermal drive-in process, and
    wherein the method further comprises:
        forming a second dipole layer over the high-k dielectric layer,
        forming a second patterned hard mask covering the second transistor,
        removing the second dipole layer from the first transistor,
        removing the second patterned hard mask from the second transistor,
        performing a second thermal drive-in process,
        removing the second dipole layer, and
        forming a work function metal layer in the first transistor and the second transistor.

5. The method of claim 4, wherein performing the second thermal drive-in process drives at least some dipole elements from the second dipole layer into the high-k dielectric layer over the second channel layer.

6. The method of claim 4, wherein the second dipole layer includes lanthanum oxide, yttrium oxide, or titanium oxide, or a combination thereof.

7. The method of claim 1, wherein forming the dipole layer over the first channel layer and the second channel layer further includes forming the dipole layer over a dielectric fin between the first channel layer and the second channel layer.

8. The method of claim 7, wherein the dielectric fin includes a first sidewall facing the first channel layer and a second sidewall facing the second channel layer,
   wherein the patterned hard mask covers the second sidewall and exposes the first sidewall,
   wherein removing the dipole layer from the first channel layer further removes the dipole layer from the first sidewall, and
   wherein the interfacial dielectric layer is further formed over the first sidewall and the second sidewall.

9. A method comprising:
   providing a first semiconductor channel layer and a second semiconductor channel layer over a substrate;
   forming an interfacial dielectric layer over the first semiconductor channel layer and the second semiconductor channel layer;
   forming a dipole layer over the interfacial dielectric layer;
   removing the dipole layer from a portion of the interfacial dielectric layer over the first semiconductor channel layer;
   performing a thermal drive-in process;
   removing remaining portions of the dipole layer; and
   forming a high-k dielectric layer over the interfacial dielectric layer.

10. The method of claim 9, wherein performing the thermal drive-in process drives dipole elements from the remaining portions of the dipole layer into the interfacial dielectric layer.

11. The method of claim 9, wherein removing the dipole layer from the portion of the interfacial dielectric layer over the first semiconductor channel layer includes:
   forming a patterned hard mask over the second semiconductor channel layer but not over the first semiconductor channel layer,
   etching the dipole layer using the patterned hard mask as an etch mask, and
   removing the patterned hard mask.

12. The method of claim 9, wherein the dipole layer is a first dipole layer, and the thermal drive-in process is a first thermal drive-in process, and
   wherein the method further comprises:
      forming a second dipole layer over the high-k dielectric layer over the second semiconductor channel layer,
      performing a second thermal drive-in process to drive dipole elements from the second dipole layer into the high-k dielectric layer,
      removing the second dipole layer,
      forming a work function metal layer over the first semiconductor channel layer and the second semiconductor channel layer, and
      forming a gate electrode layer over the work function metal layer.

13. The method of claim 12, wherein the second dipole layer includes germanium oxide, aluminum oxide, gallium oxide, zinc oxide, or a combination thereof.

14. The method of claim 12, wherein the work function metal layer is substantially free of aluminum.

15. The method of claim 9, wherein the dipole layer includes lanthanum oxide, yttrium oxide, or titanium oxide, or a combination thereof.

16. A method comprising:
   providing a workpiece including a first channel layer and a second channel layer over a substrate;
   forming a dipole layer over the second channel layer but not the first channel layer;
   forming an interfacial dielectric layer over the dipole layer and the first channel layer;
   forming a high-k dielectric layer over the interfacial dielectric layer; and
   forming a work function metal layer over the high-k dielectric layer over both the first and the second channel layers.

17. The method of claim 16, wherein the dipole layer is a p-type dipole layer, and
   wherein the method further comprises performing a drive-in process to drive dipole elements from the dipole layer into the second channel layer.

18. The method of claim 16, wherein forming the dipole layer over the second channel layer but not the first channel layer includes:
   forming the dipole layer over the first channel layer and the second channel layer,
   forming a patterned hard mask covering the dipole layer over the second channel layer but exposing the dipole layer over the first channel layer,
   etching the dipole layer using the patterned hard mask as an etch mask, and
   removing the patterned hard mask.

19. The method of claim 16, wherein the workpiece further includes a dielectric fin between the first channel layer and the second channel layer,
   wherein the dielectric fin includes a first sidewall facing the first channel layer and a second sidewall facing the second channel layer, and
   wherein forming the dipole layer over the second channel layer but not the first channel layer further includes forming the dipole layer over the second sidewall but not the first sidewall of the dielectric fin.

20. The method of claim 16, wherein the dipole layer is a first dipole layer, and
   wherein the method further comprises, before forming the work function metal layer, forming a second dipole layer over the second channel layer but not the first channel layer.

* * * * *